(12) United States Patent
Yang et al.

(10) Patent No.: US 12,302,764 B2
(45) Date of Patent: May 13, 2025

(54) IN-SITU FORMATION OF A SPACER LAYER FOR PROTECTING SIDEWALLS OF A PHASE CHANGE MEMORY ELEMENT AND METHODS FOR FORMING THE SAME

(71) Applicant: Taiwan Semiconductor Manufacturing Company Limited, Hsinchu (TW)

(72) Inventors: Tsung-Hsueh Yang, Taichung (TW); Chang-Chih Huang, Hsinchu (TW); Fu-Ting Sung, Yangmei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 479 days.

(21) Appl. No.: 17/673,862

(22) Filed: Feb. 17, 2022

(65) Prior Publication Data
US 2023/0263079 A1    Aug. 17, 2023

(51) Int. Cl.
*H10N 70/20* (2023.01)
*H10B 63/00* (2023.01)
*H10N 70/00* (2023.01)

(52) U.S. Cl.
CPC .......... *H10N 70/231* (2023.02); *H10B 63/34* (2023.02); *H10N 70/021* (2023.02);
(Continued)

(58) Field of Classification Search
CPC .................................................... H10B 63/34
See application file for complete search history.

(56) References Cited

U.S. PATENT DOCUMENTS

| 7,259,050 B2 * | 8/2007 | Chen | ........... H01L 29/6656 438/303 |
| 2008/0268565 A1 | 10/2008 | Lung | |

(Continued)

FOREIGN PATENT DOCUMENTS

TW    202036892 A    10/2020

OTHER PUBLICATIONS

Taiwanese Patent and Trademark Office, Application No. 111114536, Office Action, mailed Oct. 18, 2022, 5 pages.

*Primary Examiner* — Mounir S Amer
(74) *Attorney, Agent, or Firm* — The Marbury Law Group, PLLC

(57) ABSTRACT

An embodiment phase-change memory device includes a first electrode formed over an interconnect layer, a phase-change memory element formed over the first electrode, a second electrode formed over the phase-change memory element, and an oxygen-free spacer layer formed over sidewalls of the phase-change memory element. The phase-change memory element may include a germanium-antimony-tellurium alloy or an aluminum-antimony alloy. The phase-change memory device may include a carbon layer, configured as a heater element, formed between the first electrode and the phase-change memory element. The oxygen-free spacer layer may include SiN, SiC, or SiCN and may further include chlorine, fluorine, argon, chlorine and argon, fluorine and argon, or a mixture of chlorine, fluorine, and argon. The oxygen-free spacer layer may further include a composition that varies with position within the oxygen-free spacer layer. A further embodiment includes the phase-change memory device coupled to a selector element within a phase-change random-access memory structure.

20 Claims, 27 Drawing Sheets

(52) U.S. Cl.
CPC ......... *H10N 70/063* (2023.02); *H10N 70/841* (2023.02); *H10N 70/8825* (2023.02); *H10N 70/8828* (2023.02); *H10N 70/883* (2023.02)

(56) References Cited

U.S. PATENT DOCUMENTS

| | | | | |
|---|---|---|---|---|
| 2020/0152870 A1* | 5/2020 | Lin | .................... | H10N 70/8828 |
| 2020/0227481 A1 | 7/2020 | Jeong et al. | | |
| 2020/0373434 A1* | 11/2020 | Lee | ....................... | H01L 29/512 |
| 2022/0407000 A1* | 12/2022 | Yang | .................. | H10N 70/8616 |

* cited by examiner

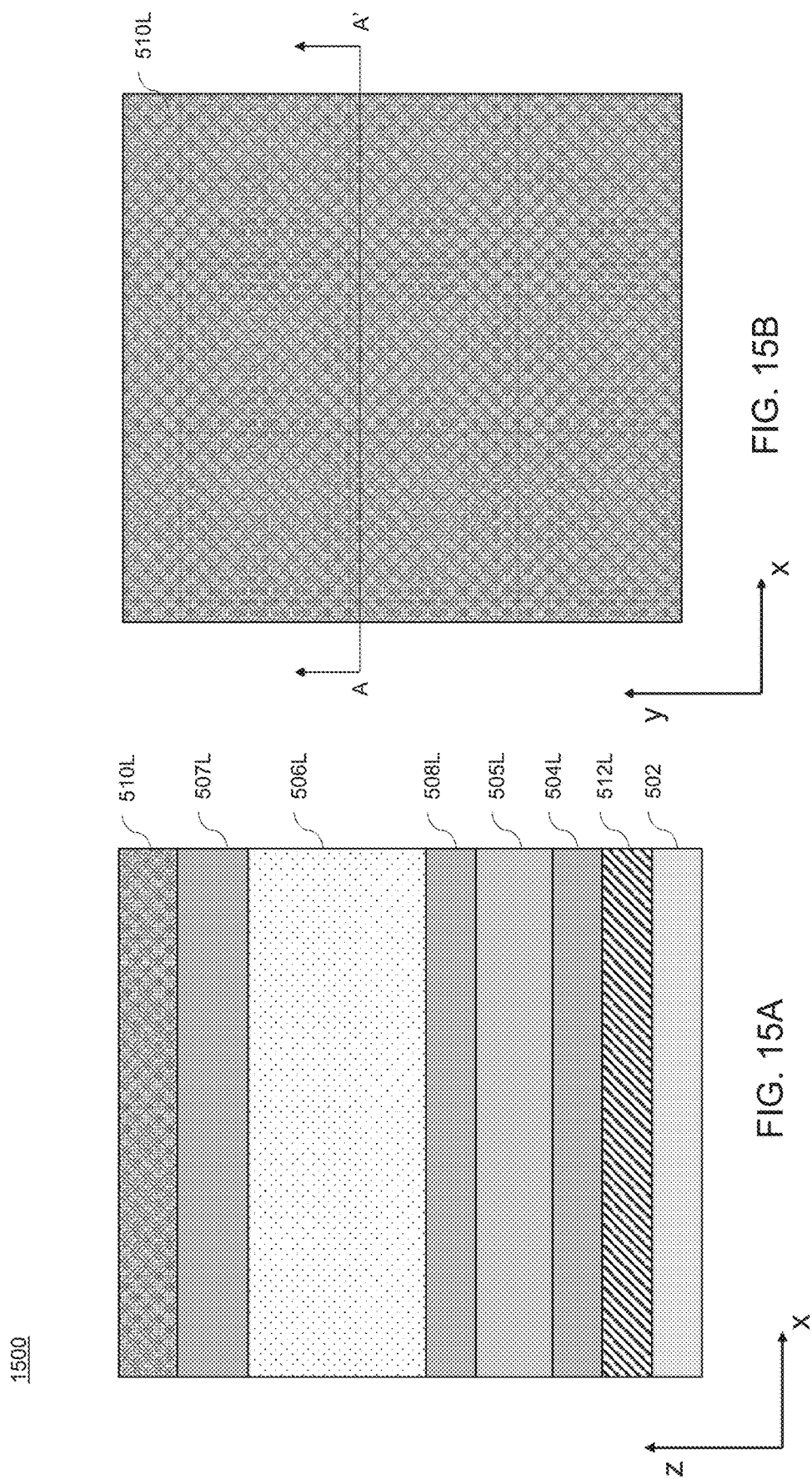

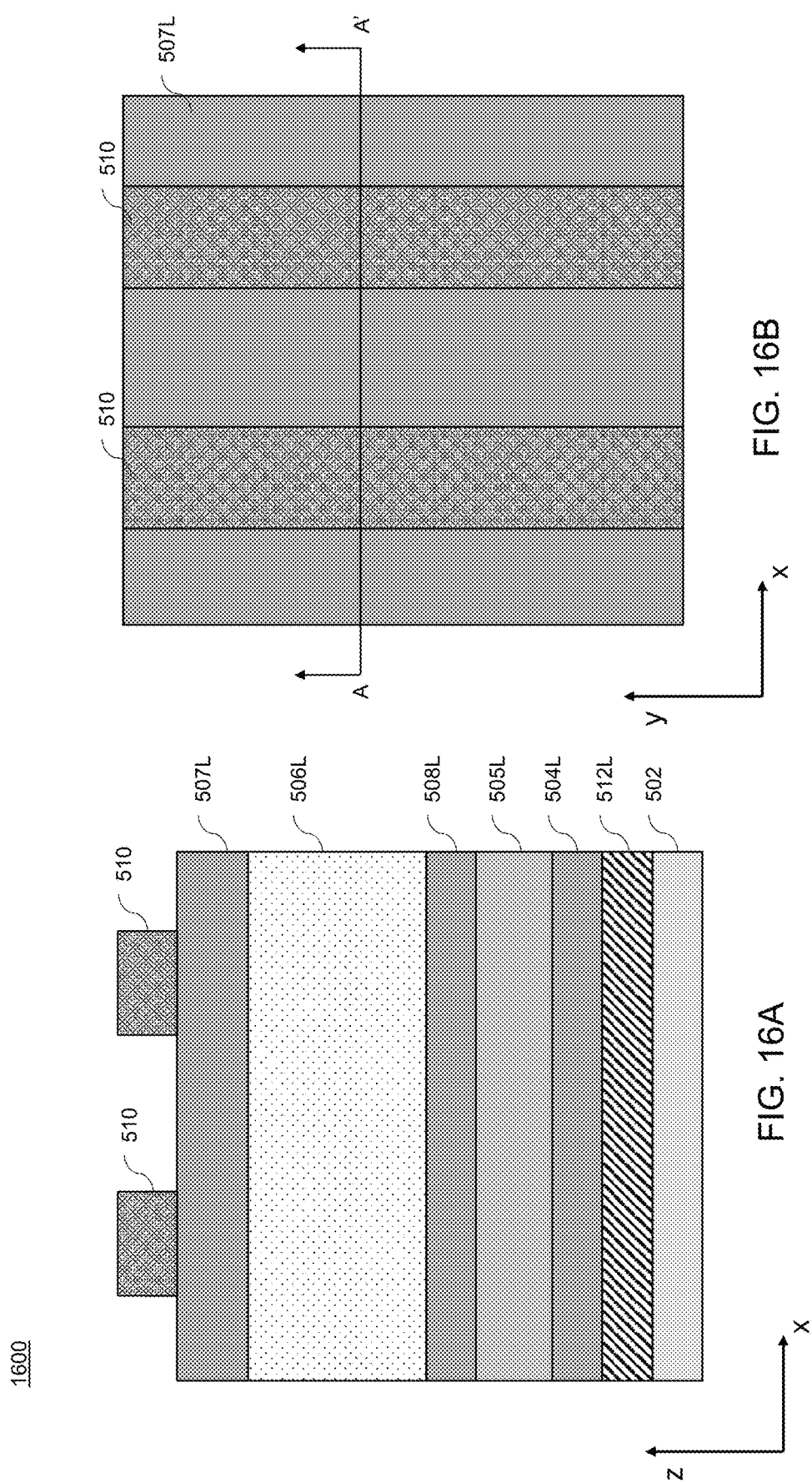

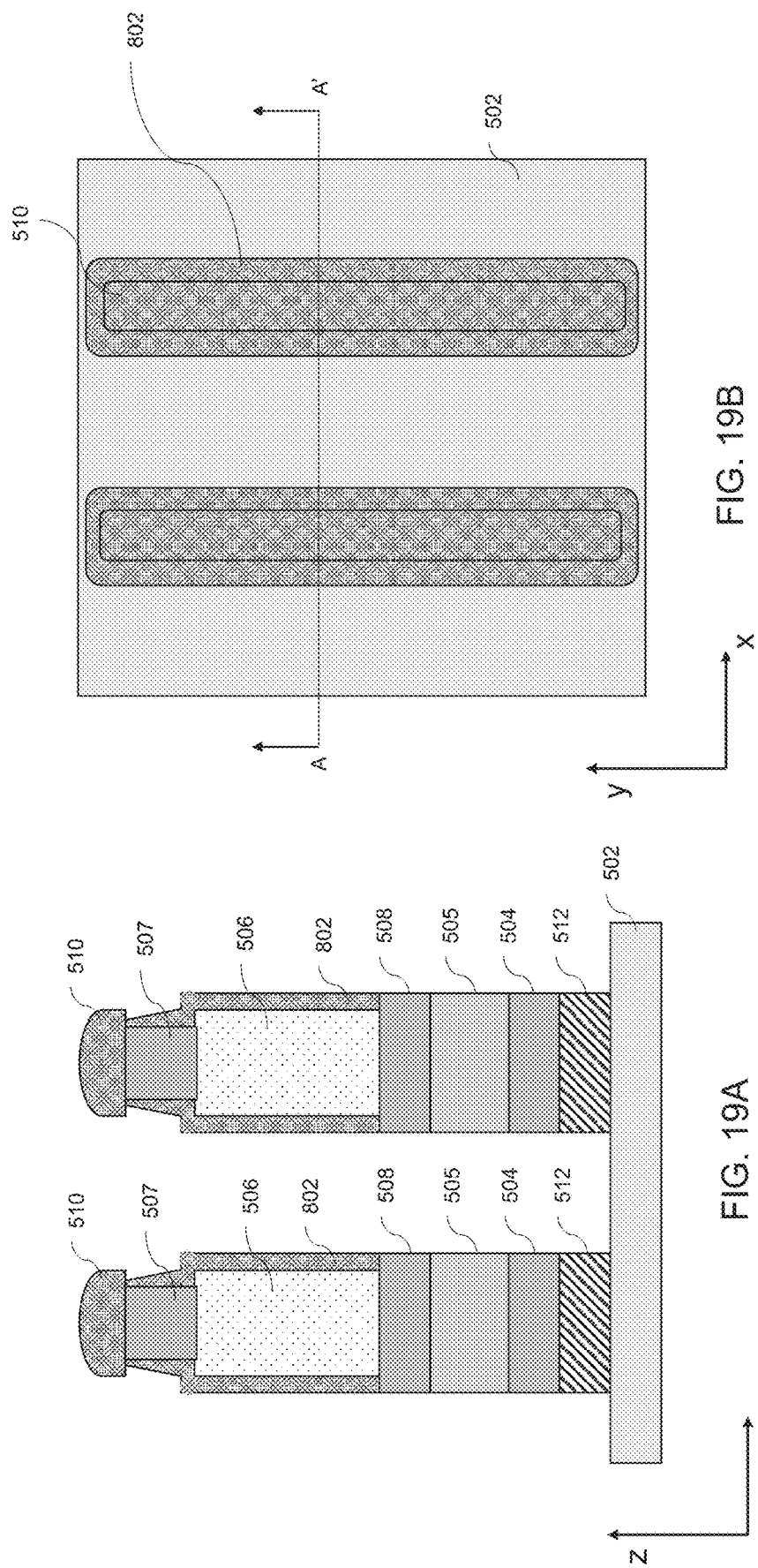

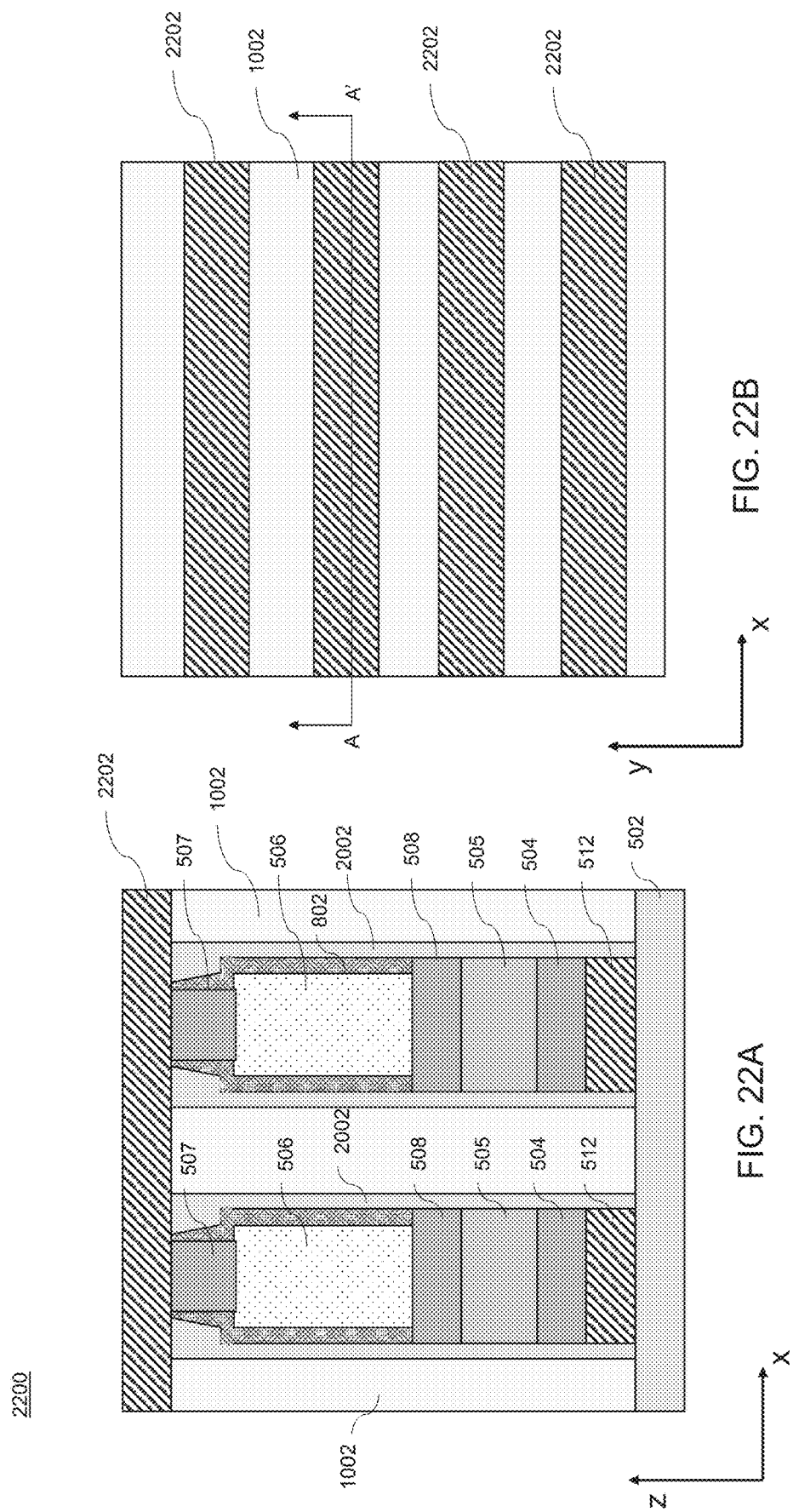

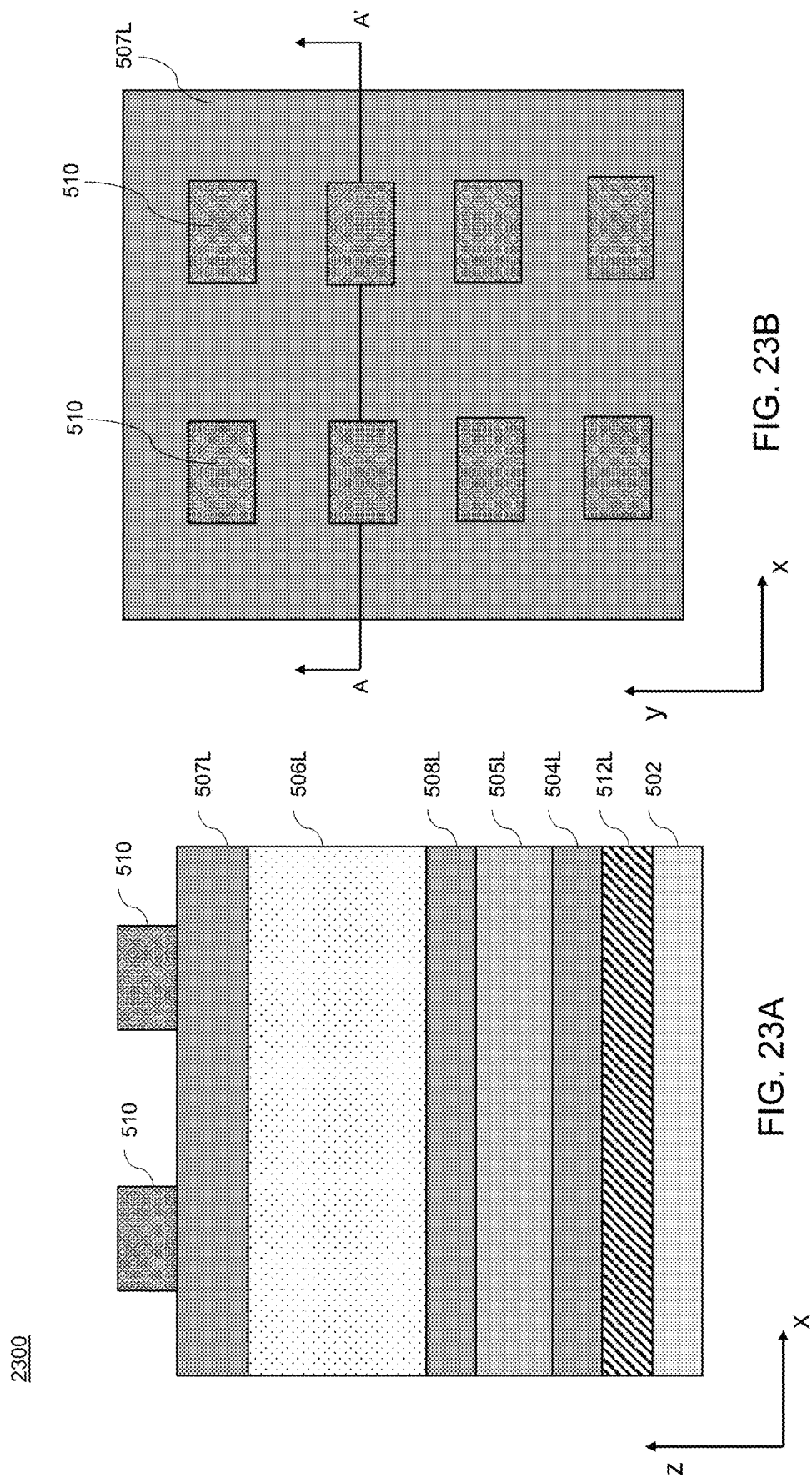

IN-SITU FORMATION OF A SPACER LAYER FOR PROTECTING SIDEWALLS OF A PHASE CHANGE MEMORY ELEMENT AND METHODS FOR FORMING THE SAME

BACKGROUND

A phase-change random-access memory (PCM or PCRAM) is a form of non-volatile random-access computer memory. PCRAM technology is based upon a material that may be either amorphous or crystalline at normal ambient temperatures. During conditions in which the material is in the amorphous state, the material has a high electrical resistance. The amorphous state may be referred to as a high resistance state (HRS). During conditions in which the material is in the crystalline state, the material has a low electrical resistance. The crystalline state may be referred to as a low resistance state (LRS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15A is a vertical cross-sectional view of an intermediate structure that may be used in the fabrication of a phase-change random-access memory structure, according to various embodiments.

FIG. 15B is a top view of the intermediate structure of FIG. 15A, according to various embodiments.

FIG. 16A is a vertical cross-sectional view of a further intermediate structure that may be used in the fabrication of a phase-change random-access memory structure, according to various embodiments.

FIG. 16B is a top view of the intermediate structure of FIG. 16A, according to various embodiments.

FIG. 19A is a vertical cross-sectional view of a further intermediate structure that may be used in the fabrication of a phase-change random-access memory structure, according to various embodiments.

FIG. 19B is a top view of the intermediate structure of FIG. 19A, according to various embodiments.

FIG. 22A is a vertical cross-sectional view of a phase-change random-access memory structure, according to various embodiments.

FIG. 22B is a top view of the phase-change random-access memory structure of FIG. 22A, according to various embodiments.

FIG. 23A is a vertical cross-sectional view of a further intermediate structure that may be used in the fabrication of a phase-change random-access memory structure, according to various embodiments.

FIG. 23B is a top view of the intermediate structure of FIG. 23A, according to various embodiments.

DETAILED DESCRIPTION

Figure 1:
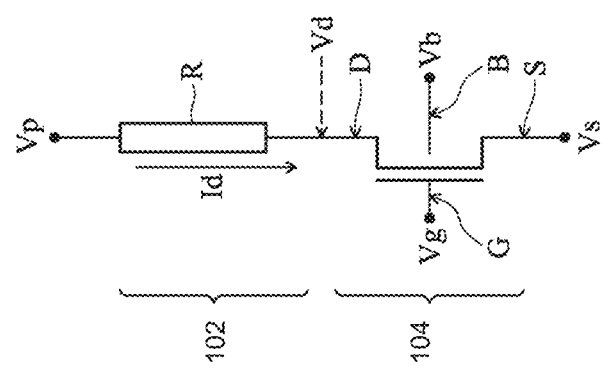
FIG. 1 is a schematic view of a phase-change random-access memory (PCRAM) structure including a phase-change memory cell and a field effect transistor, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A phase-change random-access memory (PCM or PCRAM) is a form of non-volatile random-access computer memory. PCRAM technology is based upon a material that may be either amorphous or crystalline at normal ambient temperatures. During conditions in which the material is in the amorphous state, the material has a high electrical resistance. The amorphous state may be referred to as a high resistance state (HRS). During conditions in which the material is in the crystalline state, the material has a low electrical resistance. The crystalline state may be referred to as a low resistance state (LRS).

In order to control the state of the material, the material may be heated and cooled. By heating the material above its crystallization point, the material enters its crystalline state. The material may be heated, for example, by passing current through a heating element. As the material cools, it enters an amorphous state. The change of phase in a PCRAM cell and the resulting change in electrical resistance may be used to store data in the PCRAM cell.

To change the phase of the PCRAM cell, a SET operation switches the material of the PCRAM cell to the crystalline phase and a RESET operation switches the material of the PCRAM into the amorphous phase. The SET operation crystallizes the material of the PCRAM by heating it above its crystallization temperature, and the RESET operation melt-quenches the material of the PCRAM to make the material amorphous. The SET operation and the RESET operation may be associated with different electrical current profiles or voltage profiles, such as one type of pulses for the RESET operation that heat the material of the PCRAM above its melting temperature and another type of pulses for the SET operation to heat the material of the PCRAM its crystallization temperature but below its melting temperature.

According to various embodiments of this disclosure, a phase-change memory device is provided that may be formed in a BEOL process and may be incorporated with other BEOL circuit components such as TFT devices. As such, the disclosed phase-change memory device may include materials that may be processed at low temperatures and thus, may not damage previously fabricated devices (e.g., FEOL and MEOL devices). Further, the disclosed phase-change memory device includes a phase-change element having an oxygen-free spacer layer that protects the phase-change element during processing and may act to mitigate oxidation of the phase-change element.

Various embodiment phase-change memory devices disclosed herein may include a first electrode, a phase-change memory element formed over the first electrode, a second electrode formed over the phase-change memory element, and an oxygen-free spacer layer formed over sidewalls of the phase-change memory element. The phase-change memory element may include a germanium-antimony-tellurium alloy or an aluminum-antimony alloy. In further embodiments, the phase-change memory device may further include a carbon layer, configured as a heater element, formed between the first electrode and the phase-change memory element. The oxygen-free spacer layer may include SiN, SiC, or SiCN and may further include chlorine, fluorine, argon, chlorine and argon, fluorine and argon, or a mixture of chlorine, fluorine, and argon. The oxygen-free spacer layer may further include a composition that varies with position within the oxygen-free spacer layer.

In a further embodiment, a phase-change random-access memory structure is provided. The phase-change random-access memory structure may include a plurality of word lines, a plurality of bit lines, and a plurality of phase-change memory cells. Each of the plurality of phase-change memory cells may include a first electrode electrically connected to a word line and a selector element formed over the first electrode, wherein the selector element has a non-ohmic current-voltage characteristic. Each of the phase-change memory cells may further include a phase-change memory element formed over the selector element, a second electrode formed over the phase-change memory element and electrically connected to a bit line, and an oxygen-free spacer layer formed over sidewalls of the phase-change memory element.

An embodiment method of forming the phase-change memory devices may include sequentially depositing a first conducting layer, a phase-change material layer, and a second conducting layer on an interconnect layer; forming an oxygen-free patterned mask on the second conducting layer; etching the second conducting layer and the phase-change material layer using the oxygen-free patterned mask to thereby form a second electrode and a phase-change element; etching the oxygen-free patterned mask to thereby form an oxygen-free spacer layer that is configured to protect sidewalls of the second electrode and the phase-change element, wherein the oxygen-free spacer layer comprises mask material etched from the oxygen-free patterned mask; and etching the first conducting layer to form a first electrode.

A phase-change random-access memory (PCRAM) is a non-volatile memory device that utilizes different resistive phases and heat induced phase transitions between the different resistive phases of a phase-change material to store information. Examples of the phase-change materials may be, but are not limited to, chalcogenide materials, such as germanium-antimony-tellurium (GeSbTe or GST) materials (e.g., $Ge_2Sb_2Te_5$, GeTe—$Sb_2Te_3$, etc.), and/or aluminum-antimony materials (e.g., $Al_{50}Sb_{50}$, etc.). Other suitable chalcogenide materials are within the contemplated scope of this disclosure. A PCRAM may be include many memory cells that operate independently. A PCRAM cell may include a heater and a resistor.

The PCRAM cell may operate as a data storage element made mainly of a reversible phase-change material to provide at least two different resistivities for logical "0" state and "1" states. To read a state (data) from the PCRAM cell, a sufficiently small current is applied to the phase-change material without triggering the heater to generate heat. In this way, the resistivity of the phase-change material may be measured and the states representing the resistivities, that is, a "0" state for high resistivity or a "1" state for low resistivity, for example, may be read.

To write a state (data) in the PCRAM cell, for example, to write a "1" state representing a low resistivity phase of the phase-change material, a medium electric current may be applied to the heater which generates heat for annealing the phase-change material at a temperature above the crystallization temperature but below the melting temperature of the phase-change material for a time period to achieve a crystalline phase. As the phase-change material heats to a temperature above the crystallization temperature, the material may enter a crystalline state where the phase-change material exhibits a low electrical resistance. With the low resistance value, a charge may flow into the material to establish the "1" state value.

To write a "0" state representing a high resistivity phase of the phase-change material, a large electric current may be applied to the heater to generate heat to melt the phase-change material at a temperature higher than the melting temperature of the phase-change material; and the electric current is abruptly cut off to lower the temperature to below the crystallization temperature of the phase-change material to quench and stabilize the amorphous structure of phase-change material. As the phase change material enters the amorphous state, the phase-change material exhibits a high resistance value. The high resistance value may represent a "0" state value. The large electric current may thus be in a pulse form.

PCRAM cells may have the ability to achieve a number of distinct intermediary states, thereby having the ability to hold single bits in a single cell supporting a single-level-cell (SLC) mode or multiple bits in a single cell, such as two bits supporting a multiple-level-cell (MLC) mode. In a SLC mode, the PCRAM may sometimes be referred to as a SLC type memory structure. In a MLC mode, the PCRAM may sometimes be referred to as a MLC type memory structure.

In a SLC mode, the PCRAM may fluctuate between a high resistance state (HRS) in response to a RESET operation and a low resistance state (LRS) in response to a SET operation. In a MLC mode, the PCRAM may be controlled to achieve one of multiple intermediate states between the HRS and the LRS in response to a RESET operations and the LRS in response to the SET operation.

While both a PCRAM cell operating in a SLC mode and a PCRAM cell operating in a MLC mode may be controlled by SET and RESET operations, the current operating mode of the PCRAM cell, such as a SLC mode or MLC mode, may have an impact on different SET program behavior depending on the strength of the preceding RESET operation that occurred. For example, when a RESET state of the PCRAM cell was programmed with a high energy, a subsequent SET transition may exhibit a generally smooth transition, thereby favoring MLC programming.

As another example, when a preceding RESET state of the PCRAM cell was programmed with a low energy, the subsequent SET transition may exhibit an abrupt transition, thereby favoring SLC programming. As the strength of the preceding RESET operation that occurred may impact the SLC mode and/or MLC mode operation, a PCRAM cell programming flow that transits between SLC mode and MLC mode without considering the impact of RESET behavior on the PCRAM cell may be a suboptimal programming flow. As an example, when a preceding RESET state of the PCRAM cell was programmed with a high energy, subsequent SLC programming may be more power hungry as compared to a RESET state of the PCRAM cell that was programmed with a low energy. As another example, when a preceding RESET state of the PCRAM cell was programmed with a low energy, subsequent MLC programming may be less controllable as compared to a RESET state of the PCRAM cell that was programmed with a high energy.

FIG. 1 is a schematic view of a PCRAM structure 100 constructed according to an embodiment. The PCRAM structure 100 may include one phase-change memory cell 102 and a current-controlling device 104 connected together. The phase-change memory cell 102 includes a phase-change material layer interposed between two electrodes, as described in greater detail below. In some embodiments, the resistance of the phase-change layer material may be configured to be adjusted into multiple levels that represent different logic states, respectively. In embodiments in which a phase-change layer material is configured to be adjusted into multiple levels that represent different logic states, respectively, the PCRAM structure 100 may be considered to be operating in a MLC mode. In some embodiments, the resistance of the phase-change layer material may be configured to be adjusted to a single level that represent a single logic state. In scenarios in which a phase-change layer material is configured to be adjusted to a single level that represent a single logic state, the PCRAM structure 100 may be considered to be operating in a single-level-cell (SLC) mode.

The current-controlling device 104 in the PCRAM structure 100 may be a device that is operable to control the current flow through the phase-change memory cell 102 during the operations. In the present embodiment, the current-controlling device 104 may be a transistor (or selector transistor), such as a field effect transistor (FET). For example, the FET 104 may be a metal-oxide-semiconductor (MOS) FET. The FET 104 includes source (S), drain (D) and gate (G). The source S and drain D may be designed asymmetrically, such that a voltage drop over the FET during a forming operation and an off-state leakage current may be collectively optimized. The source S and drain D may separately formed, so that the source S and drain D may be independently tuned to achieve the asymmetric structure. More particularly, the source S and drain D may be different from each other in term of doping concentration. In various embodiments, the source and drain may be different in at least one of doping concentration, doping profile, and doping species.

The FET 104 may be electrically coupled with the memory cell 102. In an embodiment, one electrode of the memory cell 102 may be connected to the drain D of the FET 104. The gate G of the FET 104 may be connected to a word line, and another electrode of the memory cell 102 may be connected to a bit line, as described in greater detail with reference to FIG. 3, below.

As illustrated in FIG. 1, the gate, source, drain, and body of the FET 104 are labeled as G, S, D, and B, respectively. The corresponding voltages of the gate, source, drain and substrate during the operations are labeled as Vg, Vs, Vd, and Vb, respectively. Furthermore, during operation, the current through the memory cell 102 is labeled as Id, and the voltage applied to one electrode of memory cell 102 from the bit line is labeled as Vp.

In one embodiment, the PCRAM structure 100 may be a two terminal memory structure, with the gate of the FET 104 operating as a first terminal, and one electrode of the memory cell 102 operating as a second terminal. The first terminal is controlled by a first voltage applied to the gate G of FET 104 from the word line, and the second terminal is controlled by a second voltage applied to the one electrode of the phase-change memory cell from the bit line. In one example, the source is grounded, and the body of the FET 104 is grounded or floating.

In another embodiment, the PCRAM structure 100 may be a three terminal memory structure, wherein the three terminals include the gate of FET 104 as a first terminal, the electrode of the memory cell 102 (the electrode that is not directly connected with the drain of the transistor) as a second terminal, and the source of the FET 104 as a third terminal. Particularly, during the operations of the phase-change memory cell 102, the first terminal (gate) may be controlled by a first voltage from the word line, the second terminal may be controlled by a second voltage from the bit line, and the third terminal may be controlled by a third voltage from a source line. In one example, the source is grounded. In an alternative example, the second terminal is grounded. The substrate (or the body) of the FET 104 may be grounded or floating.

Figure 2:
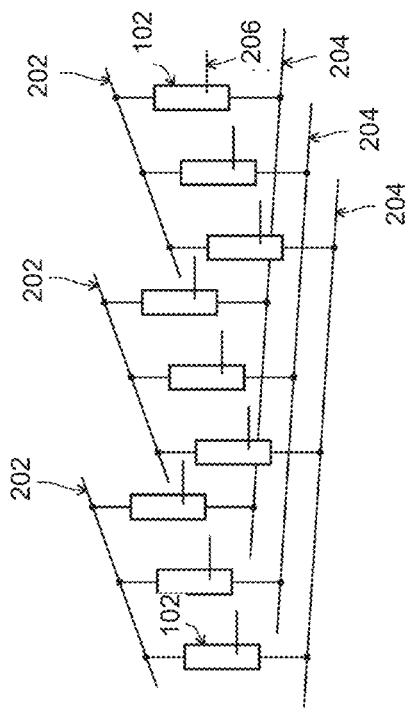
FIG. 2 is a schematic view of a PCRAM structure including multiple phase-change memory cells, according to various embodiments.

FIG. 2 is a schematic view of a memory structure 200 having a plurality of phase-change memory cells 102 constructed according various embodiments. With reference to FIGS. 1 and 2, the phase-change memory cells 102 may be configured in an array coupled with a plurality of word lines 202 and a plurality of bit lines 204. In one embodiment, the word lines 202 and the bit lines 204 may be cross-configured. Furthermore, each of the phase-change memory cells 102 may be operable to achieve single resistance levels and accordingly single bit storage (e.g., in a SLC mode) and/or multiple resistance levels and accordingly multiple bit storage (e.g., in a MLC mode). In this example embodiment, source lines 206 are configured to connect to the sources of the memory cells 102, respectively.

The source lines 206 may be configured such that one source line 206 is coupled with one respective phase-change memory cell 102. Alternatively, one source line may be coupled with a subset of the phase-change memory cells 102 in the memory structure 200. In some embodiments, the memory structure 200 may be configured such that all phase-change memory cells 102 operate in a SLC mode at a given time. In some embodiments, the memory structure 200 may be configured such that all phase-change memory cells 102 operate in a MLC mode at a given time. In some embodiments, the memory structure 200 may be configured to be partitionable such that one or more phase-change memory cells 102 operate in a SLC mode and one or more phase change memory cells 102 operate in a MLC mode at a given time.

Figure 3:
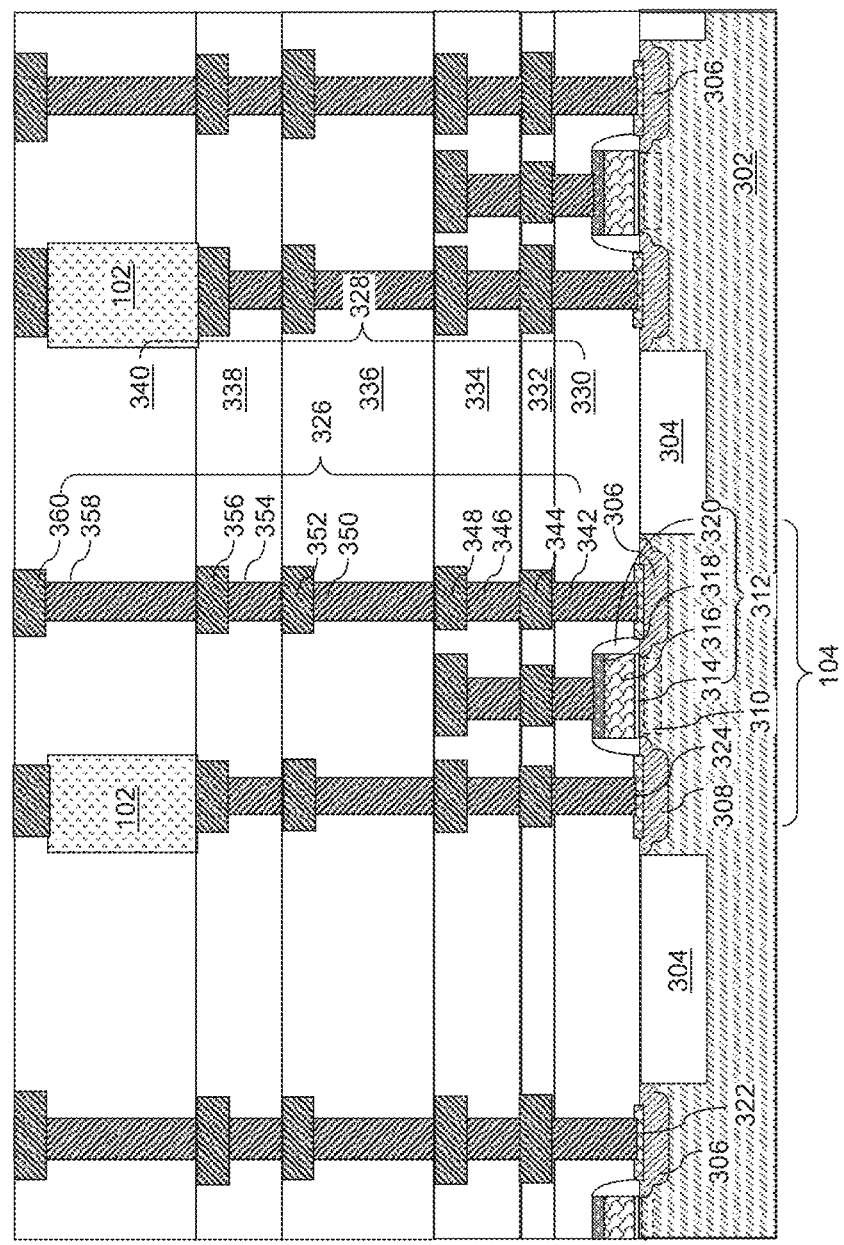
FIG. 3 is a vertical sectional view of a memory device including a phase-change memory cell and a field effect transistor (FET), according to various embodiments.

FIG. 3 is a cross sectional view of a memory device 300, according to various embodiments. With reference to FIGS. 1 to 3, the memory device 300 may include one or more phase-change memory cells 102 and corresponding field effect transistors (FETs) 104, disposed on a substrate 302. The memory device 300 may include a two-dimensional array of memory cells arranged in a one transistor-one resistor (1T1R) configuration, that is, a configuration in which one access transistor is connected to one resistive memory cell.

The substrate 302 may be a semiconductor substrate such as a commercially available silicon substrate. Alternatively, or additionally, the substrate 302 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of alloy semiconductor materials may be, but are not limited to, SiGe, GaAsP, AlInAs, AlGaAs, GaInAs, GaInP, and/or GaInAsP. Other suitable materials within the contemplated scope of this disclosure may also be used.

The FETs 104 may provide functions that are needed to operate the memory cells 102. Specifically, the FETs 104 may be configured to control the programming operation, the erase operation, and the sensing (read) operation of the memory cells 102. In some embodiments, the memory device 300 may include sensing circuitry and/or a top electrode bias circuitry on the substrate 302. The FETs 104 may include complementary metal-oxide-semiconductor (CMOS) transistors. While the embodiment illustrated in FIG. 3 illustrates a CMOS transistor, other FET transistors such as fin FET, thin-film transistors (TFT), etc., may be used as well. The substrate 302 may optionally include additional semiconductor devices (such as resistors, diodes, capacitors, inductors, etc.).

Shallow trench isolation structures 304 including a dielectric material such as silicon oxide may be formed in an upper portion of the substrate 302. Suitable doped semiconductor wells, such as p-type wells and n-type wells may be formed within each area that is laterally enclosed by a continuous portion of the shallow trench isolation structures 304. Accordingly, the FETs 104 may be formed on the substrate 302 between the isolation structures 304, such that the FETs 104 may be electrically isolated from one another by the isolation structures 304.

Each FET 104 may include a source region 306, a drain region 308, a semiconductor channel 310 that includes a surface portion of the substrate 302 extending between the source region 306 and the drain region 308, and a gate structure 312. Each gate structure 312 may include a gate dielectric 314, a gate electrode 316, a gate cap dielectric 318, and a dielectric gate spacer 320. A source-side metal-semiconductor alloy region 322 may be formed on each source region 306, and a drain-side metal-semiconductor alloy region 324 may be formed on each drain region 308.

In some embodiments, the channel region 310 may be doped with a first type dopant, and the source region 306 and the drain region 308 may be doped with a second type dopant, opposite to the first type. In this example embodiment, the FET 104 may be an n-type FET (nFET). Accordingly, the channel region 310 may be p-type channel.

In one embodiment, the source region 306 may be formed by a first ion implantation process, and the drain region 308 may be formed by a second ion implantation process. The second ion implantation process may be different from the first ion implantation process in at least one of doping dose, implanting angle and dopant (doping species). In one embodiment, the first ion implantation process may include forming a first patterned mask on the substrate, and applying the first ion implantation to the substrate using the first patterned mask as an implantation mask. The first patterned mask may include an opening such that a substrate region for the source is uncovered thereby. The first patterned mask may be a patterned photoresist layer formed by a lithography process, or alternatively, a patterned hard mask formed by lithography process and etching. Similarly, the second ion implantation process may include forming a second patterned mask on the substrate, and applying the second ion implantation to the substrate using the second patterned mask as an implantation mask. The second patterned mask may include an opening such that a substrate region for the drain is uncovered thereby. The second patterned mask may be similar to the first patterned mask in terms of formation and composition.

Various metal interconnect structures 326 formed in dielectric material layers 328 may be formed over the substrate 302 and the devices formed thereon (such as the FETs 104). The dielectric material layers may include, for example, a contact-level dielectric material layer 330, a first metal-line-level dielectric material layer 332, a second line-and-via-level dielectric material layer 334, a third line-and-via-level dielectric material layer 336, a fourth line-and-via-level dielectric material layer 338, and a fifth line-and-via-level dielectric material layer 340.

The metal interconnect structures 326 may be formed by performing any suitable deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, an electroplating process, or a plasma enhanced CVD (PECVD) process.

The metal interconnect structures may include device contact via structures 342 formed in the contact-level dielectric material layer 330 and that contact respective component of the FETs 104, first metal lines 344 formed in the first metal-line-level dielectric material layer 332, second metal via structures 346 formed in a lower portion of the second line-and-via-level dielectric material layer 334, second metal lines 348 formed in an upper portion of the second line-and-via-level dielectric material layer 334, third metal via structures 350 formed in a lower portion of the third line-and-via-level dielectric material layer 336, third metal lines 352 formed in an upper portion of the third line-and-via-level dielectric material layer 336, fourth metal via structures 354 formed in a lower portion of the fourth line-and-via-level dielectric material layer 338, fourth metal lines 356 formed in an upper portion of the fourth line-and-via-level dielectric material layer 338, fifth metal via structures 358 formed in a lower portion of the fifth line-and-via-level dielectric material layer 340, and fifth metal lines 360 formed in an upper portion of the fifth line-and-via-level dielectric material layer 340. In one embodiment, the metal interconnect structures 326 may include source lines that are connected a source-side power supply for an array of memory elements. The voltage provided by the source lines may be applied to the bottom electrodes through the access transistors provided in the memory array region 102.

Each of the dielectric material layers (330, 332, 334, 336, 338, 340) may include a dielectric material such as undoped silicate glass, a doped silicate glass, organosilicate glass, amorphous fluorinated carbon, porous variants thereof, or combinations thereof. Each of the metal interconnect structures (342, 344, 346, 348, 350, 352, 354, 356, 358, 360) may include at least one conductive material, which may be a combination of a metallic liner layer (such as a metallic nitride or a metallic carbide) and a metallic fill material. Each metallic liner layer may include TiN, TaN, WN, TIC, TaC, and WC, and each metallic fill material portion may include W, Cu, Al, Co, Ru, Mo, Ta, Ti, alloys thereof, and/or combinations thereof. Other suitable materials within the contemplated scope of this disclosure may also be used.

In one embodiment, the first metal via structures 342 and the first metal line 344 may be formed as integrated line and via structures by a dual damascene process, the second metal via structure 346 and the second metal lines 348 may be formed as integrated line and via structures by a dual damascene process, the third metal via structures 350 and the third metal lines 352 may be formed as integrated line and via structures by a dual damascene process, the fourth metal via structures 354 and the fourth metal lines 356 may be formed as integrated line and via structures by a dual damascene process, and/or the fifth metal via structures 358 and the fifth metal lines 360 may be formed as integrated line and via structures by a dual damascene process.

In some embodiments, the memory cells 102 may be disposed within the fifth dielectric material layer 340, and each memory cell 102 may be electrically connected to a respective fourth metal line 356 and a fifth metal line 360. However, the present disclosure is not limited to any particular location for the memory cells 102. For example, the memory cells 102 may be disposed within any of the dielectric material layers 328.

The metal interconnect structures 326 may be configured to connect each memory cell 102 to a corresponding FET 104, and to connect the FET 104 to corresponding signal lines. For example, the drain region 308 of the FET 104 may be electrically connected to a bottom electrode of the memory cell 102 via, for example, a subset of the metallic via structures (342, 346, 350, 354) and a subset of the metal lines (344, 348, 352, 356). Each drain region 308 may be connected to a first node (such as a bottom node) of a respective memory cell 102 via a respective subset of the metal interconnect structures 326. The gate electrode 316 of each FET 104 may be electrically connected to a word line, which may be embodied as a subset of the metal interconnect structures 326. A top electrode of each memory cell 102 may be electrically connected to a respective bit line, which is embodied as a respective subset of the metal interconnect structures. Each source region 306 may be electrically connected to a respective source line, which is embodied as a respective subset of the metal interconnect structures. While only five levels of metal lines are illustrated in FIG. 3, it is understood that more metal line levels may be formed above the illustrated levels of FIG. 3. Further, it is understood that the levels in which the source lines, word lines, and bit lines are formed may be selected based on design parameters.

Figure 4:
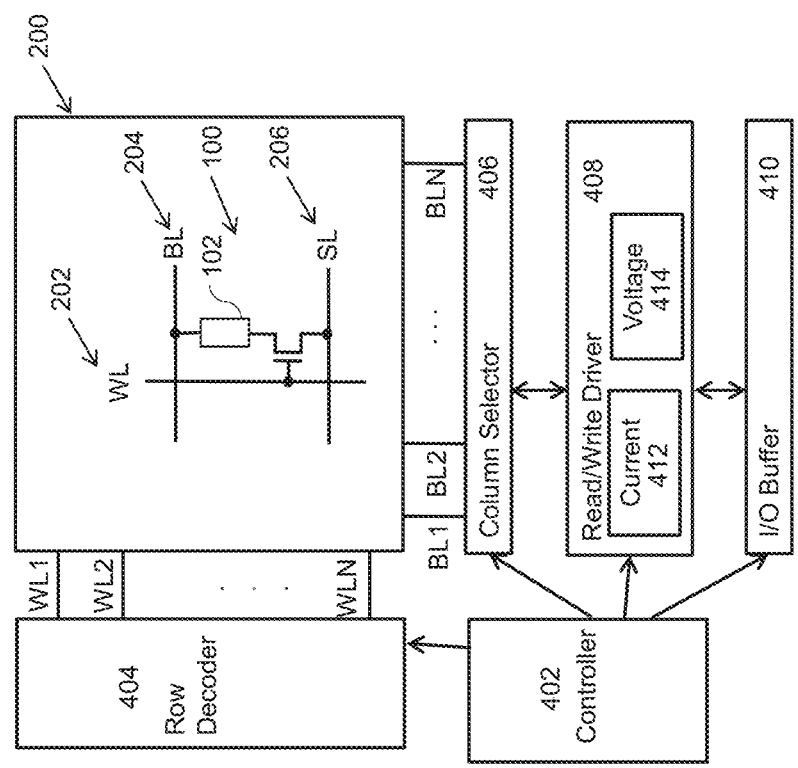
FIG. 4 is a block diagram of a memory circuit, according to various embodiments.

FIG. 4 is a block diagram of a memory circuit 400, according to various embodiments. With reference to FIGS. 1 to 4, the memory circuit 400 may be configured to implement various embodiment methods for configuring a memory structure, such as a PCRAM cell 102 of a PCRAM structure 100. The memory circuit 400 may be configured to control an operating mode (e.g., SLC mode and/or MLC mode) of the PCRAM structure that is part of a memory structure, such as a PCRAM cell 102 of a PCRAM structure 100 (e.g., see FIG. 1), which is part of a memory structure 200 having a plurality of PCRAM cells 102 (e.g., see FIG. 2), and/or to control the RESET program conditions used in programming the PCRAM structure 100. Only a single PCRAM structure 100 is illustrated in FIG. 4 for ease of illustration, but additional structures 100 may be included in the memory structure 200, as described above with reference to FIG. 2.

The memory circuit 400 may include a controller 402, a row decoder 404, a column selector 406, a read/write driver 408, and one or more input/output (I/O) buffers 410. In various embodiments, the controller 402 may be coupled to the row decoder 404 and the column selector 406. In various embodiments, the row decoder 404 may be coupled to the word lines (WL), such as word lines 202 of the memory structure 200, as described above with reference to FIG. 2.

The memory structure 200 may include any number of WLs 1-N, where N is an integer. The column selector 406 may be coupled to the bit lines (BL), such as bit lines 204 discussed above, of the memory structure 200. The memory structure 200 may include any number of BLs 1-N, where N is an integer. The controller 402 may additionally be coupled to the read/write driver 408 and/or the one or more I/O buffers 410. The one or more I/O buffers 410 and read/write driver 408 may be coupled to one another and/or coupled to the column selector 406. The controller 402 may receive various signals from external circuitry related to the circuit 400. For example, the controller 402 may receive commands, such as configuration change commands, from a host controller or processor to transition a PCRAM cell 102 from a SLC mode of operation to a MLC mode of operation or from a MLC mode of operation to a SLC mode of operation.

The controller 402 may determine a type of a received configuration change command to determine whether the received configuration change command is a SLC mode to MLC mode type configuration change command or a MLC to SLC mode type configuration change command. The controller 402 may transmit signals to the row decoder 404, column selector 406, and/or read/write driver 408 to cause the row decoder 404, column selector 406, and/or read/write driver 408 to perform operations to change the states of the PCRAM cells 102 and/or to sense the states of the PCRAM cells 102. For example, the controller 402 may transmit signals to the row decoder 404, column selector 406, and/or read/write driver 408 to cause the row decoder 404, column selector 406, and/or read/write driver 408 to perform operations to perform READ, SET, and/or RESET operations for the PCRAM cells 102 and/or to sense the current of the PCRAM cell 102 (e.g., $I_{cell}$).

In various embodiments, the controller 402 may select different RESET program conditions based at least in part on a determined type of a received configuration change command. For example, a RESET program condition configured to generate a waveform with a selected current amplitude and/or pulse width may be selected in response to determining that a received configuration change command is a SLC mode to MLC mode type configuration change command. A different RESET program condition configured to generate a waveform with another selected current amplitude and/or another pulse width may be selected in response to determining that a received configuration change command is a MLC mode to SLC mode type configuration change command.

In various embodiments, the controller 402 may transmit signals to the row decoder 404, column selector 406, and/or read/write driver 408 to cause the row decoder 404, column selector 406, and/or read/write driver 408 to perform operations to program the PCRAM cell 102 using the selected RESET program conditions. In various embodiments, the read/write driver 408 may include a current sensing circuit 412 and a voltage sensing circuit 414. In various embodiments, the read/write driver 408, and/or the current sensing circuit 412 specifically, may be configured to apply a selected read voltage (e.g., $V_{read}$) to a PCRAM cell 102, and the current sensing circuit 412 may be configured to sense the resulting cell current ($I_{cell}$). In various embodiments, the read/write driver 408, and/or the current sensing circuit 412 specifically, may be configured to store the sensed cell current ($I_{cell}$) in the one or more I/O buffers 410. In various embodiments, the read/write driver 408, and/or the voltage sensing circuit 414 specifically, may be configured to apply a selected read current (e.g., $I_{read}$) to a PCRAM cell 102, and the voltage sensing circuit 414 may be configured to sense the resulting cell voltage ($V_{cell}$). In various embodiments, the read/write driver 408, and/or the voltage sensing circuit 414 specifically, may be configured to store the sensed cell voltage ($V_{cell}$) in the one or more I/O buffers 410.

In various embodiments, the one or more I/O buffers 410 may be one or more buffers providing storage for current sensing and/or voltage sensing results of the memory structure 200, such as $I_{cell}$, $V_{cell}$, etc. Additionally, the one or more I/O buffers 410 may store other values, such as results of comparing current sensing and/or voltage sensing (e.g., $I_{cell}$, $V_{cell}$, etc.) to stored threshold values, threshold values themselves (e.g., verification current conditions, verification voltage conditions, etc.), RESET program conditions (e.g., waveform attributes, such as current amplitudes, pulse widths, etc.), etc. In various embodiments, the one or more I/O buffers 410 may be configured to output values, such as $I_{cell}$, $V_{cell}$, threshold values, RESET program conditions, etc., to other circuitry, such as the controller 402 and/or other external circuitry related to the memory circuit 400.

Figure 5:
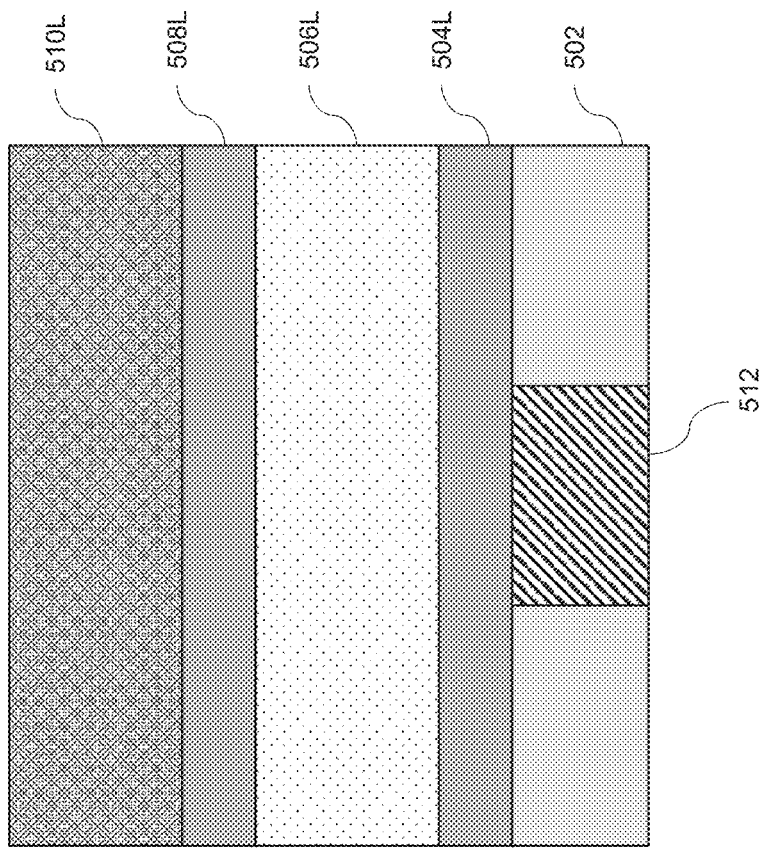
FIG. 5 is a vertical cross-sectional view of an intermediate structure that may be used in the fabrication of a phase-change memory cell, according to various embodiments.

FIG. 5 is a vertical cross-sectional view of an intermediate structure 500 that may be used in the fabrication of a phase-change memory cell, according to various embodiments. The intermediate structure 500 may include a layer stack (502, 504L, 506L, 508L, 510L) that includes a substrate 502, a first conducting layer 504L, a phase-change material layer 506L, a second conducting layer 508L, and a dielectric layer 510L. The first conducting layer 504L, the phase-change material layer 506L, the second conducting layer 508L, and the dielectric layer 510L may be formed as planar blanket (i.e., un-patterned) layers each having a respective planar top surface and a respective planar bottom surface.

The intermediate structure 500 may be formed in a BEOL process. As such, the substrate 502 may be a dielectric layer (e.g., see inter-layer dielectric or insulating matrix layer 338 shown in FIG. 3) that may embed one or more conductive structures 512. The one or more conductive structures 512 may be electrically connected to various interconnect structures (e.g., metal interconnect structures 326 shown in FIG.

3) formed below the substrate 502. Each of the one or more conductive structures 512 may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of this disclosure may also be used.

The substrate 502 may include, for example, undoped silicate glass, a doped silicate glass (e.g., deposited by decomposition of tetraethylorthosilicate (TEOS)), organosilicate glass, silicon oxynitride, or silicon carbide nitride. Other dielectric materials are within the contemplated scope of this disclosure. The dielectric material of the substrate 502 may be deposited by a conformal deposition process (such as a chemical vapor deposition process) or a self-planarizing deposition process (such as spin coating). The thickness of the substrate 502 may be in a range from approximately 15 nm to approximately 60 nm, such as from approximately 20 nm to approximately 40 nm, although smaller and larger thicknesses may also be used.

The phase-change material layer 506L may be, but is not limited to, a chalcogenide material, such as a germanium-antimony-tellurium (GeSbTe or GST) material (e.g., Ge2Sb2Te5, GeTe—Sb2Te3, etc.), and/or aluminum-antimony material (e.g., Al50Sb50, etc.). Other suitable chalcogenide materials are within the contemplated scope of this disclosure. Each of the first conducting layer 504L and the second conducting layer 508L may include a conducting material that is compatible with the phase-change material layer 506L. For example, the first conducting layer 504L and the second conducting layer 508L may include TiN, TaN, or other suitable conducting material. The dielectric layer 510L may be chosen to be an oxygen-free dielectric layer. For example, the dielectric layer 510L may include SiC, SiN, or SiCN. Each of the layers in the layer stack layer stack (502, 504L, 506L, 508L, 510L) may be deposited by a conformal or non-conformal deposition process. In one embodiment, the layers in the layer stack layer stack (502, 504L, 506L, 508L, 510L) may be deposited by CVD, PVD, ALD or other suitable deposition process.

Figure 6:
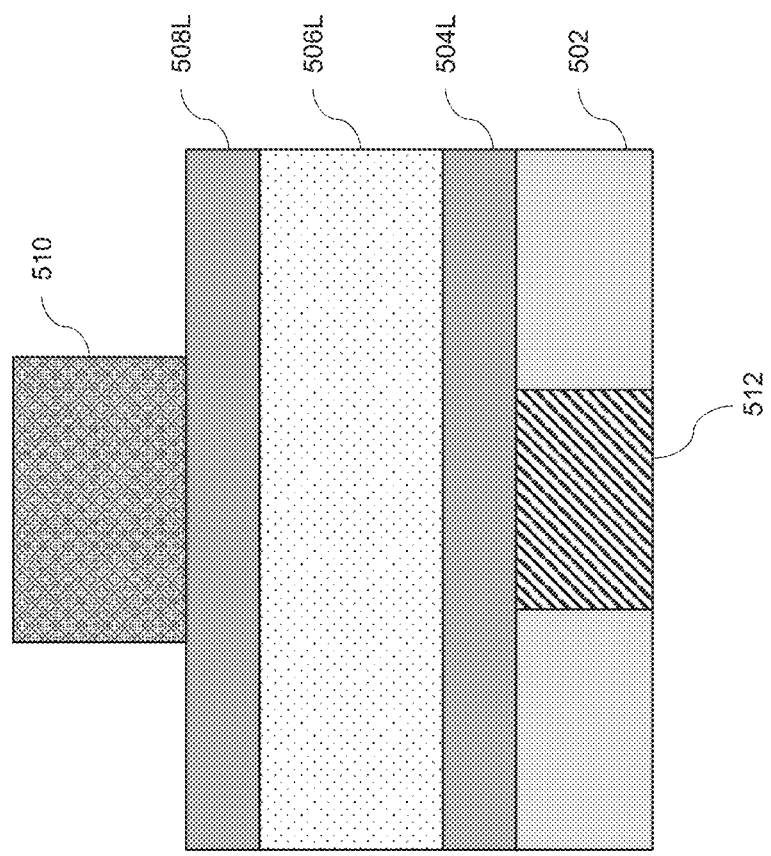
FIG. 6 is a vertical cross-sectional view of a further intermediate structure that may be used in the fabrication of a phase-change memory cell, according to various embodiments.

FIG. 6 is a vertical cross-sectional view of a further intermediate structure 600 that may be used in the fabrication of a phase-change memory cell, according to various embodiments. The intermediate structure 600 may be formed from the intermediate structure 500 of FIG. 5 by patterning the dielectric layer 510L to form an oxygen-free patterned mask 510 on the second conducting layer 508L. The dielectric layer 510L may be patterned by depositing a photoresist (not shown) over the dielectric layer 510L and patterning the photoresist using photolithographic techniques. The patterned photoresist may then be used as a mask for etching the dielectric layer 510L using an anisotropic etching process that is selective to the second conducting layer 508L. The patterned photoresist may then be removed by ashing or by dissolution with a solvent.

Figure 7:
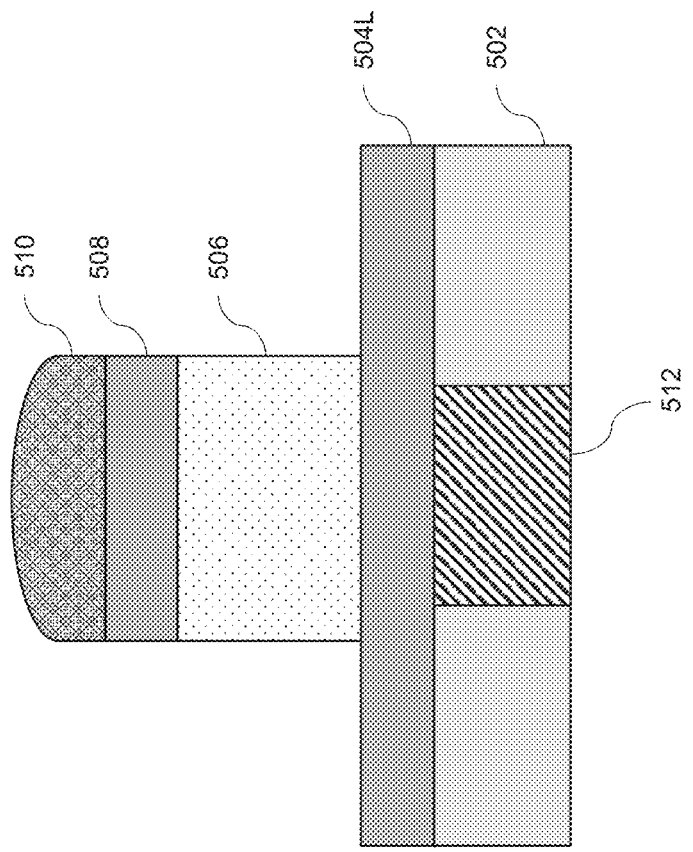
FIG. 7 is a vertical cross-sectional view of a further intermediate structure that may be used in the fabrication of a phase-change memory cell, according to various embodiments.

FIG. 7 is a vertical cross-sectional view of a further intermediate structure 700 that may be used in the fabrication of a phase-change memory cell, according to various embodiments. The intermediate structure 700 may be formed from the intermediate structure 600 of FIG. 6 by etching the second conducting layer 508L and the phase-change material layer 506L using the oxygen-free patterned mask 510. In this regard, the second conducting layer 508L may be etched in a first anisotropic etch process and the phase-change material layer 506L may be etched in a second anisotropic etch process. For example, the second conducting layer 508L may be etched using a reactive ion etch (RIE) process using a hydrogen bromide (HBr) plasma, a hydrogen bromide/argon (HBr/Ar) plasma or other suitable RIE plasma. The phase-change material layer 506L may then be etched in a RIE process using a methane-hydrogen ($CH_4/H_2$) plasma, a $CH_4$ plasma, a $N_2$ plasma, an Ar plasma, an $H_2$ plasma, etc.

A phase-change element 506 and a top electrode 508 for a phase-change memory cell may thereby be formed by respectively etching the second conducting layer 508L and the phase-change material layer 506L. In a further etching process (e.g., described below with reference to FIG. 9), the first conducting layer 504L may be etched to form a bottom electrode 504 for a phase-change memory cell. For example, the first conducting layer 504L may etched in a RIE process using an HBr plasma, as was used to etch the second conducting layer 508L. Such an etching process, however, may cause damage to the phase-change element 506. In further embodiments, therefore, a protective layer may be formed over sidewalls of the phase-change element 506 to thereby protect the phase-change element 506 during the RIE process that is used to etch the first conducting layer 504L, as described in greater detail with reference to FIG. 8, below.

Figure 8:
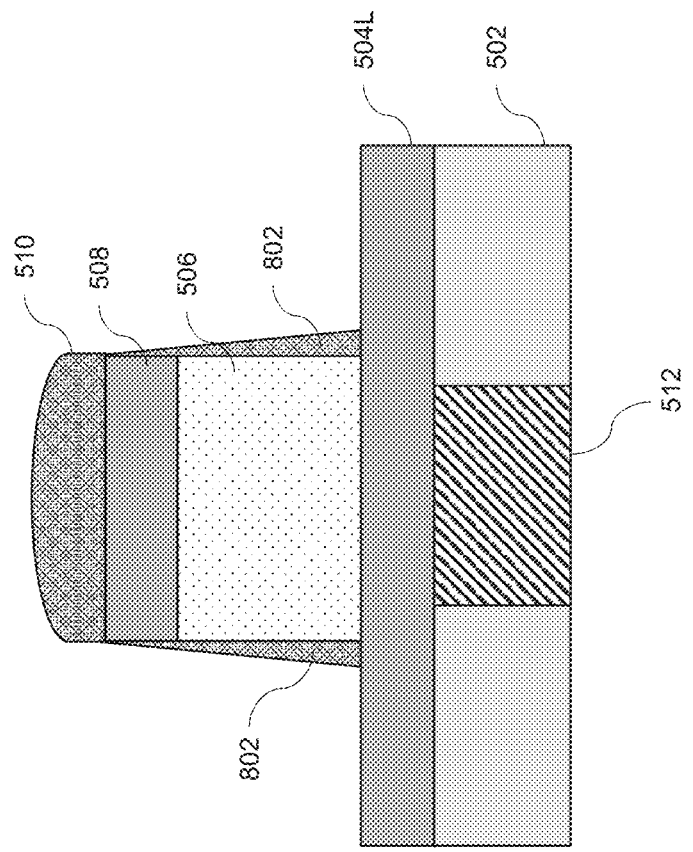
FIG. 8 is a vertical cross-sectional view of a further intermediate structure that may be used in the fabrication of a phase-change memory cell, according to various embodiments.

FIG. 8 is a vertical cross-sectional view of a further intermediate structure 800 that may be used in the fabrication of a phase-change memory cell, according to various embodiments. The intermediate structure 800 may be formed from the intermediate structure 700 by etching the oxygen-free patterned mask 510. For example, the oxygen-free patterned mask 510 may be physically etched by bombarding the oxygen-free patterned mask 510 with a suitable flow of ions. For example, the oxygen-free patterned mask 510 may be bombarded with argon ions. Argon ions have a higher atomic mass and little or no reactivity with atoms of the oxygen-free patterned mask 510. As such, bombardment with argon ions may provide a physical etch (i.e., a non-reactive etch) of the oxygen-free patterned mask 510. The process of bombarding the oxygen-free patterned mask 510 with argon ions may cause material to be removed from the oxygen-free patterned mask. Such removed material may form an oxygen-free spacer layer 802 over sidewalls of the phase-change element 506. According to an embodiment, the oxygen-free spacer layer 802 may have a thickness in a range from approximately 15 angstroms to approximately 40 angstroms and may correspond to approximately 100 angstroms of material etched from the oxygen-free patterned mask 510.

As described above, the oxygen-free patterned mask 510 may include SiN, SiC, or SiCN. As such, the oxygen-free spacer layer 802 may also include SiN, SiC, or SiCN. Further, the oxygen-free spacer layer 802 may further include argon that may become incorporated into the oxygen-free spacer layer 802 due to the interaction between the argon ions and the oxygen-free patterned mask 510. The oxygen-free spacer layer 802 may protect the phase-change memory element 506 during further processing. Further, the absence of oxygen in the oxygen-free spacer layer 802 may be beneficial in mitigating oxidation of the phase-change memory element 506.

In further embodiments, the oxygen-free patterned mask 510 may be etched using a chemical etching process. For example, an RIE process using a fluorine or chlorine plasma may be used to chemically etch material from the oxygen-free patterned mask 510. As with a physical etching process, described above, material may be removed from the oxygen-free patterned mask 510 and may thereby form the oxygen-free spacer layer 802. As such, with a chemical etch process, certain chemical species from the etch plasma may become incorporated into the oxygen-free spacer layer 802. For example, a RIE process that includes a fluorine and/or chlorine plasma may cause fluorine and/or chlorine to be incorporated into the oxygen-free spacer layer 802.

In certain embodiments, the oxygen-free patterned mask 510 may be etched with a combined physical/chemical etch process. For example, a physical etch may be followed by a chemical etch or vice versa. As such, the oxygen-free spacer layer 802 may include chlorine, fluorine, argon, chlorine and argon, fluorine and argon, or a mixture of chlorine, fluorine, and argon. Further, the oxygen-free spacer layer 802 may have a composition that varies with position within the oxygen-free spacer layer 802. For example, if a physical etch process is performed first followed by a chemical etch process, the oxygen-free spacer layer 802 that results from the combined process may have a composition that has a higher concentration of argon closer to sidewalls of the phase-change element 506 and a concentration of chlorine and/or fluorine that his higher is positions closer to external edges of the oxygen-free spacer layer 802. Various other composition profiles may be generated in the oxygen-free spacer layer 802 in other embodiments through application of various physical and chemical etching processes.

Figure 9:
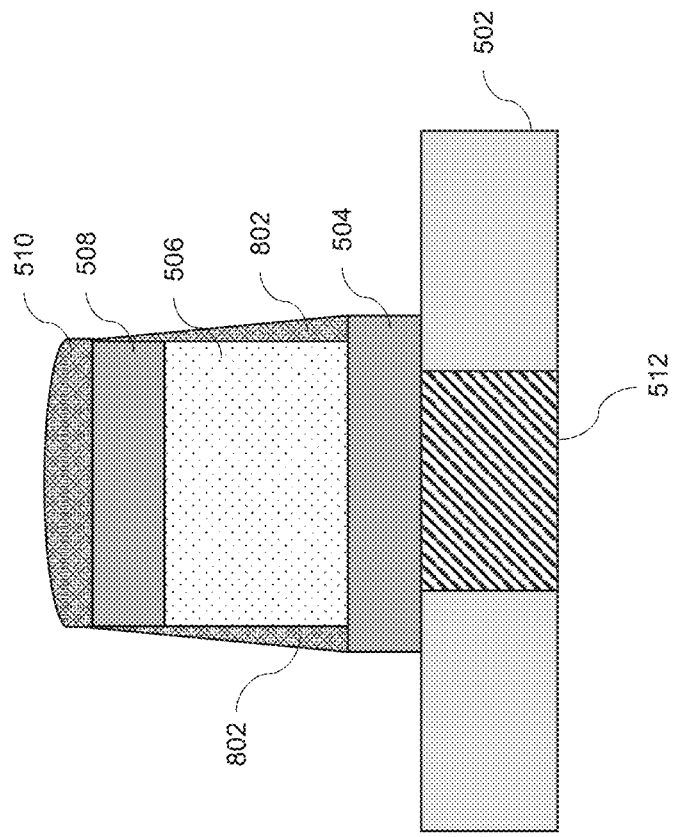
FIG. 9 is a vertical cross-sectional view of a further intermediate structure that may be used in the fabrication of a phase-change memory cell, according to various embodiments.

FIG. 9 is a vertical cross-sectional view of a further intermediate structure 900 that may be used in the fabrication of a phase-change memory cell, according to various embodiments. The intermediate structure 900 may be formed from the intermediate structure 800 by performing an anisotropic etch of the first conducting layer 504L. For example, the first conducting layer 504L may be etched using an RIE process using a HBr plasma. Etching the first conducting layer 504L may thereby form a bottom electrode 504 of a phase change memory cell to be subsequently formed. According to an embodiment, the oxygen-free patterned mask 510 may have a width/diameter of approximately 45 nm, the top electrode 508 may have a width/diameter of approximately 50 nm and a height of approximately 20 nm, the phase-change element 506 may have a width/diameter of approximately 55 nm and a height of approximately 35 nm, the bottom electrode 504 may have a width/diameter of approximately 60 nm and a height of approximately 20 nm, and the first conductive structure 512 may have width/diameter of approximately 55 nm and a height of approximately 50 nm.

Figure 10:
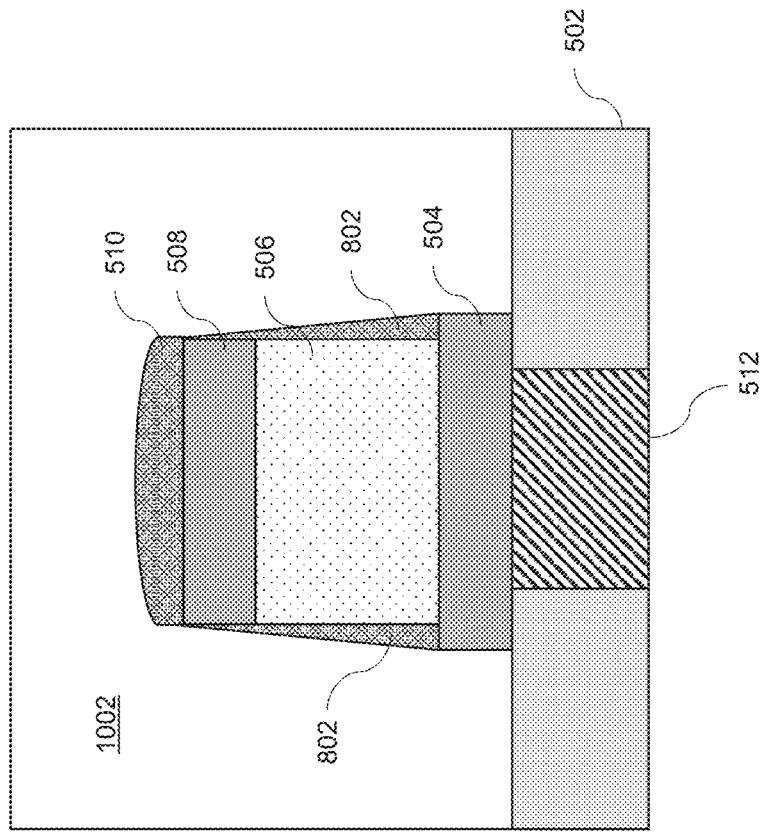
FIG. 10 is a vertical cross-sectional view of a further intermediate structure that may be used in the fabrication of a phase-change memory cell, according to various embodiments.

FIG. 10 is a vertical cross-sectional view of a further intermediate structure 1000 that may be used in the fabrication of a phase-change memory cell, according to various embodiments. The intermediate structure 1000 may be formed from the intermediate structure 900 by forming a dielectric layer 1002 over the intermediate structure 900. In this regard, the dielectric layer 1002 may be the same material as the substrate 502. In alternative embodiments, the dielectric layer 1002 may be a different material from that of the substrate 502.

The dielectric layer 1002 may include, for example, undoped silicate glass, a doped silicate glass (e.g., deposited by decomposition of tetraethylorthosilicate (TEOS)), organosilicate glass, silicon oxide, silicon oxynitride, or silicon carbide nitride. Other dielectric materials are within the contemplated scope of this disclosure. The dielectric layer 1002 may be deposited by a conformal deposition process (such as a chemical vapor deposition process) or a self-planarizing deposition process (such as spin coating). Excess portions of the dielectric layer 1002 may be removed from above the top surface of the structure (e.g., at a certain distance above the oxygen-free patterned mask 510) by a planarization process, for example, by chemical mechanical planarization (CMP).

Figure 11:
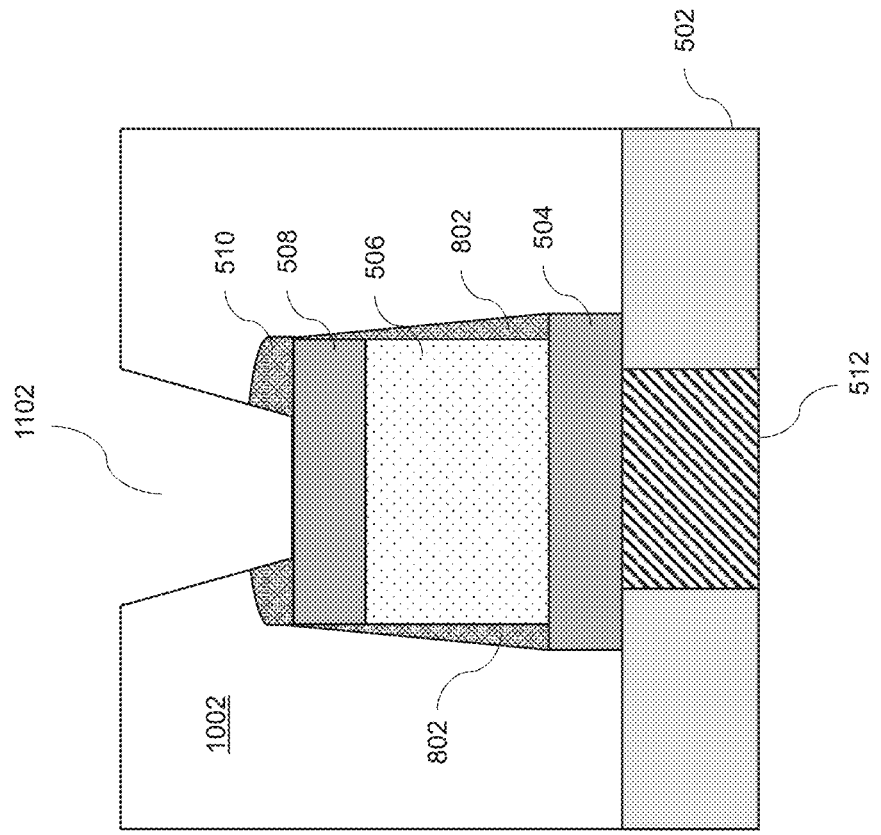
FIG. 11 is a vertical cross-sectional view of a further intermediate structure that may be used in the fabrication of a phase-change memory cell, according to various embodiments.

FIG. 11 is a vertical cross-sectional view of a further intermediate structure 1100 that may be used in the fabrication of a phase-change memory cell, according to various embodiments. The intermediate structure 1100 may formed from the intermediate structure 1000 by etching the dielectric layer 1002 to form a via 1102. For example, a photoresist (not shown) may be deposited over the dielectric layer 1002 and may be patterned using photolithographic techniques to form a patterned photoresist. The patterned photoresist may then be used as an etch mask to etch the dielectric layer 1002. An anisotropic etch process may be performed to remove portions of the dielectric layer and the oxygen-free patterned mask 510 to thereby expose a top surface of the top electrode 508. The patterned photoresist may then be removed by ashing or dissolution with a solvent.

Figure 12:
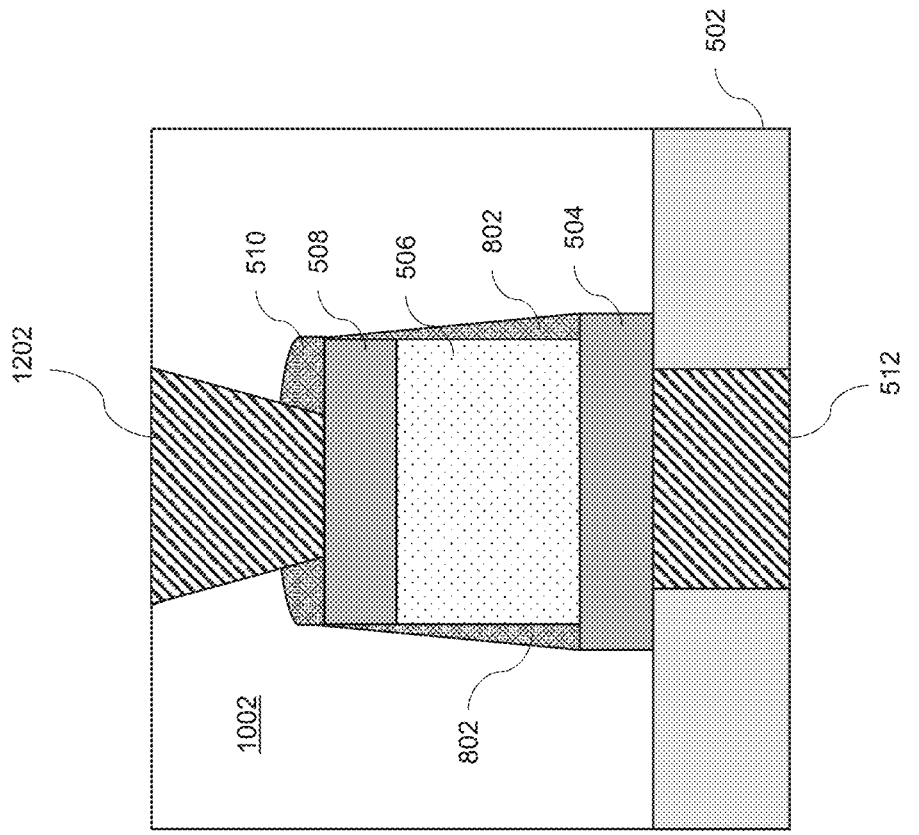
FIG. 12 is a vertical cross-sectional view of a phase-change memory cell, according to various embodiments.

FIG. 12 is a vertical cross-sectional view of a phase-change memory cell 102, according to various embodiments. The phase-change memory cell 102 may be formed from the intermediate structure 1100 by forming a conductive structure 1202 in the via 1102 formed in the dielectric layer 1002. The conductive structure 1202 may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of this disclosure may also be used.

The conductive structure 1202 may be connected to a fifth metal line 360 (e.g., see FIG. 3), as mentioned above. Similarly, the conductive structure 512 may be connected to a fourth metal line 356. In this way, the phase-change memory cell 102 may be connected to a current-controlling device, such as the FET 104 (e.g., see FIGS. 1 and 3). For example, the conductive structure 512 may be connected to the drain D of the FET 104 and the conductive structure 1202 may be connected to a bit line, as described above. Thus, in this example embodiment, the memory cell 102 may be disposed within the fifth dielectric material layer 340 (e.g., see FIG. 3). However, the present disclosure is not limited to any particular location for the memory cells 102. For example, the memory cells 102 may be disposed within any of the dielectric material layers 328.

Figure 13:
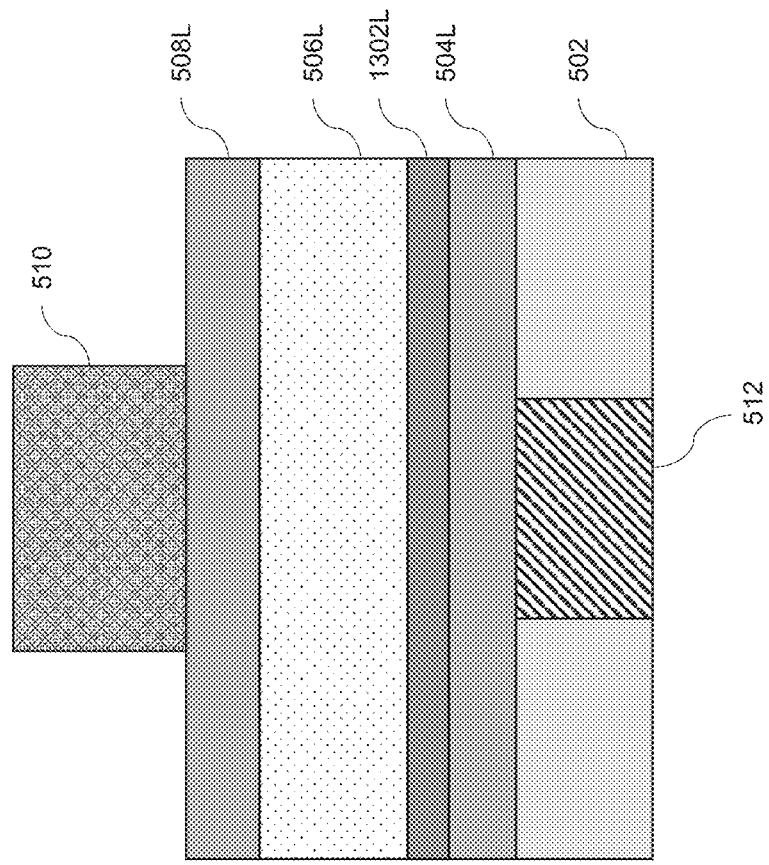
FIG. 13 is a vertical cross-sectional view of a further intermediate structure that may be used in the fabrication of a phase-change memory cell, according to various embodiments.

FIG. 13 is a vertical cross-sectional view of a further intermediate structure 1300 that may be used in the fabrication of a phase-change memory cell, according to various embodiments. The intermediate structure 1300 may include a layer stack (502, 504L, 1302L, 506L, 508L, 510) that includes a substrate 502, a first conducting layer 504L, a phase-change material layer 506L, a second conducting layer 508L, and oxygen-free patterned mask 510. In this regard, the intermediate structure 1300 is similar to the intermediate structure 600 of FIG. 6. In contrast to the intermediate structure 600 of FIG. 6, however, the intermediate structure 1300 may further include a carbon layer 1302L. As described in greater detail with reference to FIG. 14, below, the carbon layer 1302L may be patterned to form a heater element 1302 (e.g., see FIG. 14 and related description). According to an embodiment, the carbon layer 1302L may be deposited as an amorphous carbon film having a thickness in a range from approximately 45 nm to approximately 55 nm.

The first conducting layer 504L, the carbon layer 1302L, the phase-change material layer 506L, the second conducting layer 508L, and the dielectric layer 510L may be formed as planar blanket (i.e., un-patterned) layers each having a respective planar top surface and a respective planar bottom surface. The intermediate structure 1300 may be formed in a BEOL process. As such, the substrate 502 may be a dielectric layer (e.g., an inter-layer dielectric or insulating matrix layer 338 from FIG. 3) that may embed one or more conductive structures 512. The one or more conductive structures 512 may be electrically connected to various interconnect structures (e.g., metal interconnect structures 326 in FIG. 3) formed below the substrate 502. The intermediate structure 1300 may be processed by performing similar operations as described above with references to FIGS. 7 to 12 to thereby form a phase-change memory cell 102, as shown in FIG. 14.

Figure 14:
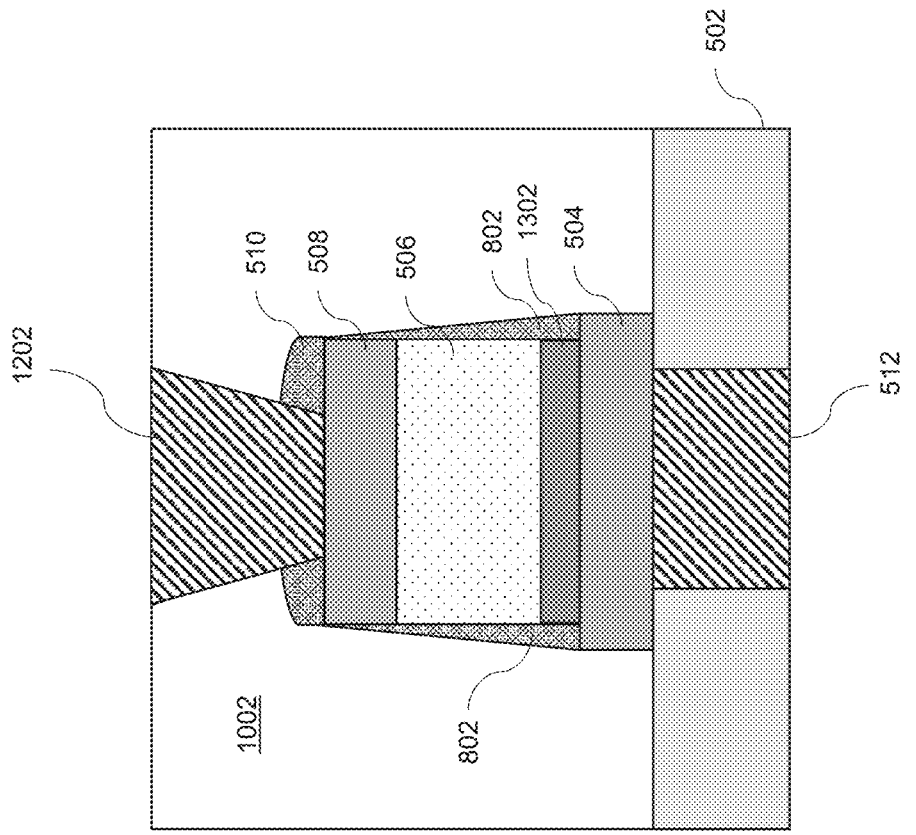
FIG. 14 is a vertical cross-sectional view of a phase-change memory cell, according to various embodiments.

FIG. 14 is a vertical cross-sectional view of a phase-change memory cell 102, according to various embodiments. The phase-change memory cell 102 includes a bottom electrode 504, a heater element 1302, a phase-change element 506, and a top electrode 508. The bottom electrode 504 may be electrically connected to the conductive structure 512, and the top electrode 508 may be electrically connected to the conductive structure 1202. Further, as with the phase-change memory cell 102 of FIG. 12, the conductive structure 1202 may be connected to a fifth metal line 360 (e.g., see FIG. 3), as mentioned above. Similarly, the conductive structure 512 may be connected to a fourth metal line 356. In this way, the phase-change memory cell 102 may be connected to a current-controlling device, such as the FET 104 (e.g., see FIGS. 1 and 3). For example, the conductive structure 512 may be connected to the drain D of the FET 104 and the conductive structure 1202 may be connected to a bit line, as described above.

The heater element 1302 may be configured to generate heat when a current is passed through the heater element 1302. In this regard, the heater element 1302 may have a resistance R that generates heat per unit time (i.e., power) given by P=I2R. As described above, a resistive state of the phase-change element 506 may be changed by heating the phase-change element 506 at various rates. The inclusion of a heater element 1302 may increase the resistance of the phase-change memory cell 102 and may thereby allow greater heat to be generated for a given applied current I. As such, the current I required to change a resistive state of the phase-change element 506 within the phase-change memory cell 102 may be reduced relative to a corresponding phase-change memory cell 102 that does not include the heater element 1302 (e.g., see FIG. 12).

FIG. 15A is a vertical cross-sectional view of an intermediate structure 1500 that may be used in the fabrication of an alternative embodiment phase-change random-access memory structure, and FIG. 15B is a top view of the intermediate structure of FIG. 15A, according to various embodiments. The cross section A-A' shown in FIG. 15B indicates the cross sectional view of FIG. 15A. The intermediate structure 1500 may include a layer stack (502, 512L, 504L, 505L, 508L, 506L, 507L, 510L) that includes a substrate 502, a metal layer 512L, a first conducting layer 504L, a selector material layer 505L, a second conducting layer 508L, a phase-change material layer 506L, a third conducting layer 507L, and a dielectric layer 510L.

The metal layer 512L, the first conducting layer 504L, the selector material layer 505L, the second conducting layer 508L, the phase-change material layer 506L, the third conducting layer 507L, and the dielectric layer 510L may be formed as planar blanket (i.e., un-patterned) layers each having a respective planar top surface and a respective planar bottom surface. Each of the layers in the layer stack layer stack (502, 512L, 504L, 505L, 508L, 506L, 507L, 510L) may be deposited by a conformal or non-conformal deposition process. In one embodiment, the layers in the layer stack layer stack (502, 512L, 504L, 505L, 508L, 506L, 507L, 510L) may be deposited by CVD, PVD, ALD or other suitable deposition process.

The intermediate structure 1500 may be formed in a BEOL process. As such, the substrate 502 may be a dielectric layer (e.g., an inter-layer dielectric or insulating matrix layer 338 from FIG. 3). The substrate 502 may include, for example, undoped silicate glass, a doped silicate glass (e.g., deposited by decomposition of TEOS), organosilicate glass, silicon oxynitride, or silicon carbide nitride. Other dielectric materials are within the contemplated scope of this disclosure.

The metal layer 512L may be deposited on the substrate 502 and may be patterned to form an interconnect structure (e.g., metal interconnect structures 326 in FIG. 3) for a phase-change random-access memory structure to be subsequently formed. The metal layer 512L may include any suitable metal, such as copper, aluminum, zirconium, titanium, tungsten, tantalum, ruthenium, palladium, platinum, cobalt, nickel, or alloys thereof. Other suitable metal materials are within the contemplated scope of this disclosure.

The phase-change material layer 506L may be, but is not limited to, a chalcogenide material, such as a germanium-antimony-tellurium (GeSbTe or GST) material (e.g., Ge2Sb2Te5, GeTe—Sb2Te3, etc.), and/or aluminum-antimony material (e.g., Al50Sb50, etc.). Other suitable chalcogenide materials are within the contemplated scope of this disclosure. Each of the first conducting layer 504L and the second conducting layer 508L may include a conducting material that is compatible with the phase-change material layer 506L. For example, the first conducting layer 504L and the second conducting layer 508L may include TiN, TaN, or other suitable conducting material. The dielectric layer 510L may be chosen to be an oxygen-free dielectric layer. For example, the dielectric layer 510L may include SiC, Si, or SiCN.

The selector material layer 505L may include a non-ohmic material that provides electrical connection or electrical isolation depending on the magnitude and/or the polarity of an externally applied voltage bias thereacross. In one embodiment, the selector material layer 505L may include at least one threshold switch material layer. The at least one threshold switch material layer may include any suitable threshold switch material which exhibits non-linear electrical behavior, such as an ovonic threshold switch (OTS) material or volatile conductive bridge. In another embodiment, the selector material layer 505L may include at least one non-threshold switch material layer, such as a tunneling selector material or a diode material (e.g., a materials for a p-n semiconductor diode, a p-i-n semiconductor diode, a Schottky diode or a metal-insulator-metal diode).

As used herein, a threshold switch material, such as, but not limited to, an ovonic threshold switch material, refers to a material that displays a non-linear resistivity as a function of an applied external bias voltage such that the resistivity of the material decreases with the magnitude of the applied external bias voltage. In other words, the threshold switch material is non-ohmic, and becomes more conductive under a higher external bias voltage than under a lower external bias voltage. As used herein, an ovonic threshold switch is a device that includes a chalcogen containing OTS material layer which does not crystallize in a low resistivity state under a voltage above the threshold voltage, and reverts back to a high resistivity state when not subjected to a voltage above a critical holding voltage across the OTS material layer.

An ovonic threshold switch material (OTS material) may be non-crystalline (for example, amorphous) in a high resistivity state, and may remain non-crystalline (for example, remain amorphous) in a low resistivity state during application of a voltage above its threshold voltage across the OTS material. The OTS material may revert back to the high resistivity state when the high voltage above its threshold voltage is lowered below a critical holding voltage. Throughout the resistivity state changes, the ovonic threshold switch material may remain non-crystalline (e.g., amorphous).

In one embodiment, the ovonic threshold switch material may include an amorphous chalcogenide material which exhibits hysteresis in both the write and read current polarities. The chalcogenide material may contain S, Se, and/or Te chalcogen material alloyed with Si, Ge, Sn, P, As, and/or Sb, and may be doped with B, C, N, O, and/or In. Exemplary ovonic threshold switch materials include SiTe, GeTe, GeSe, or GeSeAs, with atomic compositions for constituent elements ranging from 5 to 95%. The ovonic threshold switch material layer may contain any ovonic threshold switch material.

In one embodiment, the ovonic threshold switch material layer may include a compound of at least one Group 14 element and at least one Group 16 element. In one embodiment, the ovonic threshold switch material layer may include, and/or may consist essentially of, a material selected from a GeSeAs alloy (e.g., Ge10As35Se55), a GeTeAs alloy, a GeSeTe alloy, a GeSe alloy, a SeAs alloy, a AsTe alloy, a GeTe alloy, a SiTe alloy (e.g., Si20Te80), a SiAsTe alloy, or SiAsSe alloy, with atomic compositions for constituent elements ranging from 5 to 95%. The at least one ovonic threshold switch material portion may be optionally doped with N, O, C, P, Ge, As, Te, Se, In, and/or Si to thereby decrease thermal conductivity and to increase a threshold electrical field (i.e., the electrical field above which the material becomes conductive).

In one embodiment, the material of the selector material layer 505L may be selected such that the resistivity of the selector material layer 505L therein decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer 505L may be selected such that the critical bias voltage magnitude may be in a range from 1 V to 6 V, although lesser and greater voltages may also be employed for the critical bias voltage magnitude. The thickness of the selector material layer 505L may be, for example, in a range from 1 nm to 50 nm, such as from 5 nm to 25 nm, although lesser and greater thicknesses may also be employed.

FIG. 16A is a vertical cross-sectional view of a further intermediate structure 1600 that may be used in the fabrication of an alternative embodiment of a phase-change random-access memory structure, and FIG. 16B is a top view of the intermediate structure of FIG. 16A, according to various embodiments. The cross section A-A' shown in FIG. 16B indicates the cross sectional view of FIG. 16A. The intermediate structure 1600 may be formed from the intermediate structure 1500 of by patterning the dielectric layer 510L (e.g., see FIGS. 15A and 15B) to form an oxygen-free patterned mask 510 on the third conducting layer 507L.

The dielectric layer 510L may be patterned by depositing a photoresist (not shown) over the dielectric layer 510L and patterning the photoresist using photolithographic techniques. The patterned photoresist may then be used as a mask for etching the dielectric layer 510L using an anisotropic etching process that is selective to the third conducting layer 507L. The patterned photoresist may then be removed by ashing or by dissolution with a solvent. As shown in FIG. 16B, the dielectric layer may be patterned as a one-dimensional array of elongated structures separated along a first direction (e.g., along the x direction in FIGS. 16A and 16B) and extending along a second direction (e.g., along the y direction in FIG. 16B). In other embodiments, the dielectric layer may be patterned to form an oxygen-free patterned mask 510 having a two-dimensional array of isolated structures, as described in greater detail with reference to FIGS. 23A to 25B, below.

Figure 17B:
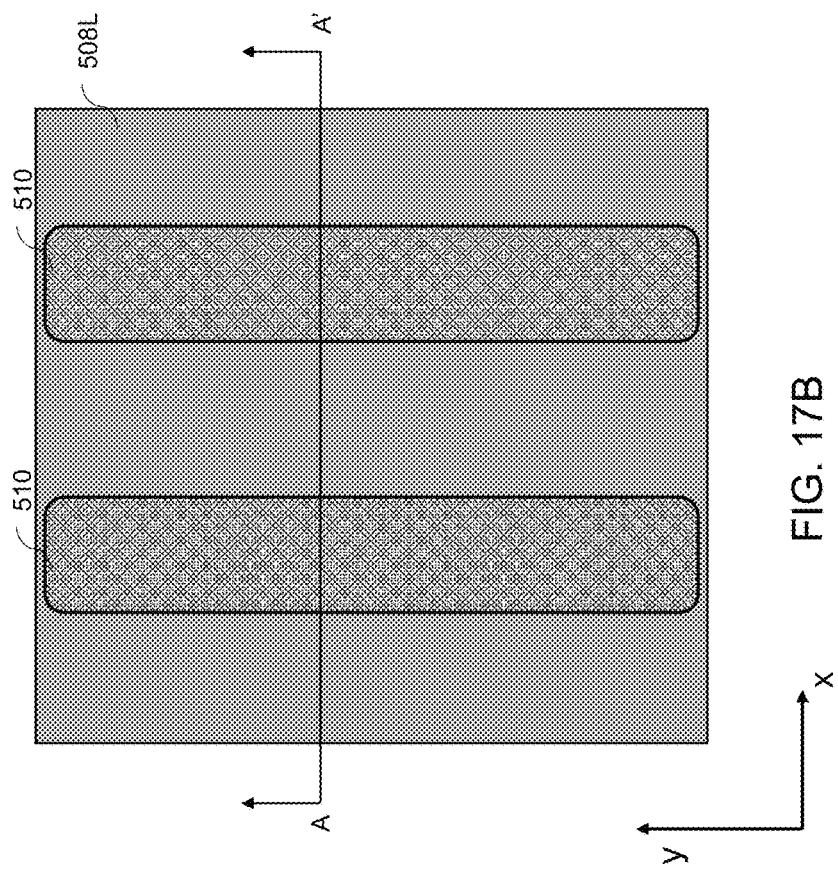
FIG. 17B is a top view of the intermediate structure of FIG. 17A, according to various embodiments.
Figure 17A:
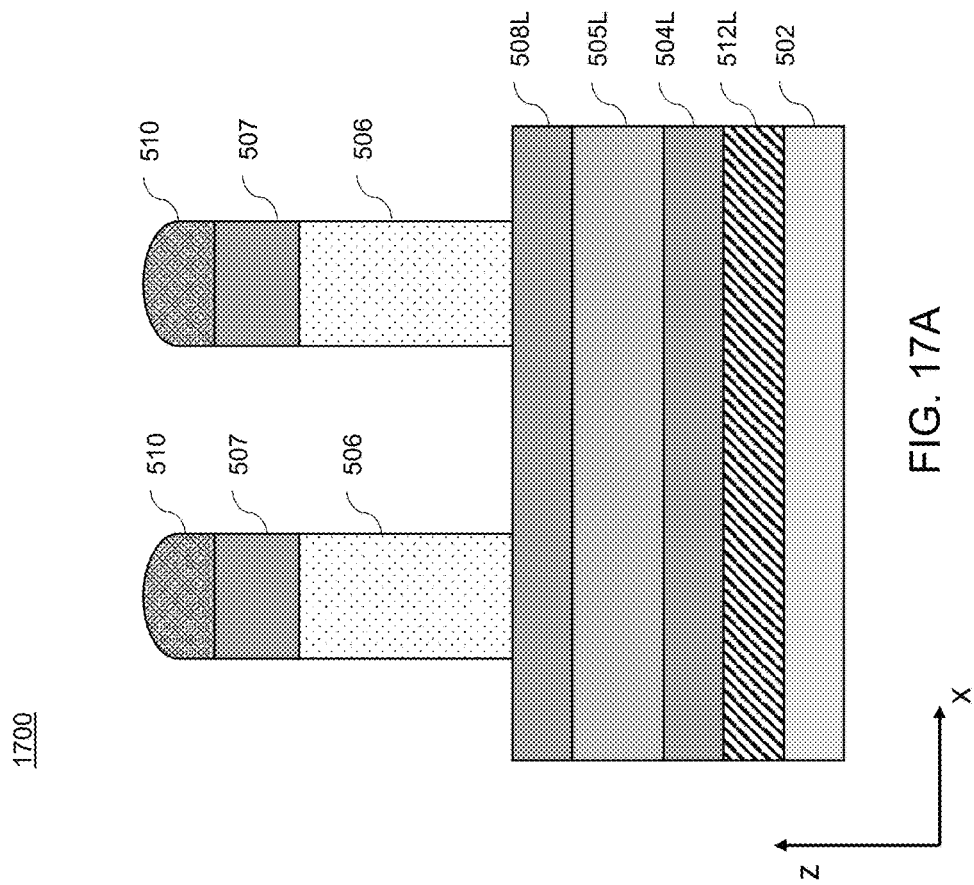
FIG. 17A is a vertical cross-sectional view of a further intermediate structure that may be used in the fabrication of a phase-change random-access memory structure, according to various embodiments.

FIG. 17A is a vertical cross-sectional view of a further intermediate structure 1700 that may be used in the fabrication of an alternative embodiment of a phase-change random-access memory structure, and FIG. 17B is a top view of the intermediate structure of FIG. 17A, according to various embodiments. The cross section A-A' shown in FIG. 17B indicates the cross sectional view of FIG. 17A. The intermediate structure 1700 may be formed from the intermediate structure 1600 by etching the third conducting layer 507L and the phase-change material layer 506L using the oxygen-free patterned mask 510. In this regard, the third conducting layer 507L may be etched in a first anisotropic etch process and the phase-change material layer 506L may be etched in a second anisotropic etch process. For example, the third conducting layer 507L may be etched using a RIE process using a hydrogen bromide (HBr) plasma. The phase-change material layer 506L may then be etched in a RIE process using a CH4/H2 plasma.

A phase-change element 506 and a top electrode 507 for a phase-change memory cell may thereby be formed by respectively etching the third conducting layer 507L and the phase-change material layer 506L. In a further etching process (e.g., described below with reference to FIGS. 19A and 19B), the second conducting layer 508L may be etched to form a bottom electrode 508 for a phase-change memory cell. The selector material layer 505L, the first conducting layer 504L and the metal layer 512L may similarly be etched. These additional layers (512L, 504L, 505L, 508L) may be etched using various processes, for example, in a RIE process using an HBr plasma, as was used to etch the third conducting layer 507L. These additional etching processes, however, may cause damage to the phase-change element 506. In further embodiments, therefore, a protective layer may be formed over sidewalls of the phase-change element 506 to thereby protect the phase-change element 506 during the RIE process that is used to etch the remaining layers (512L, 504L, 505L, 508L), as described in greater detail with reference to FIGS. 18A and 18B, below.

Figure 18B:
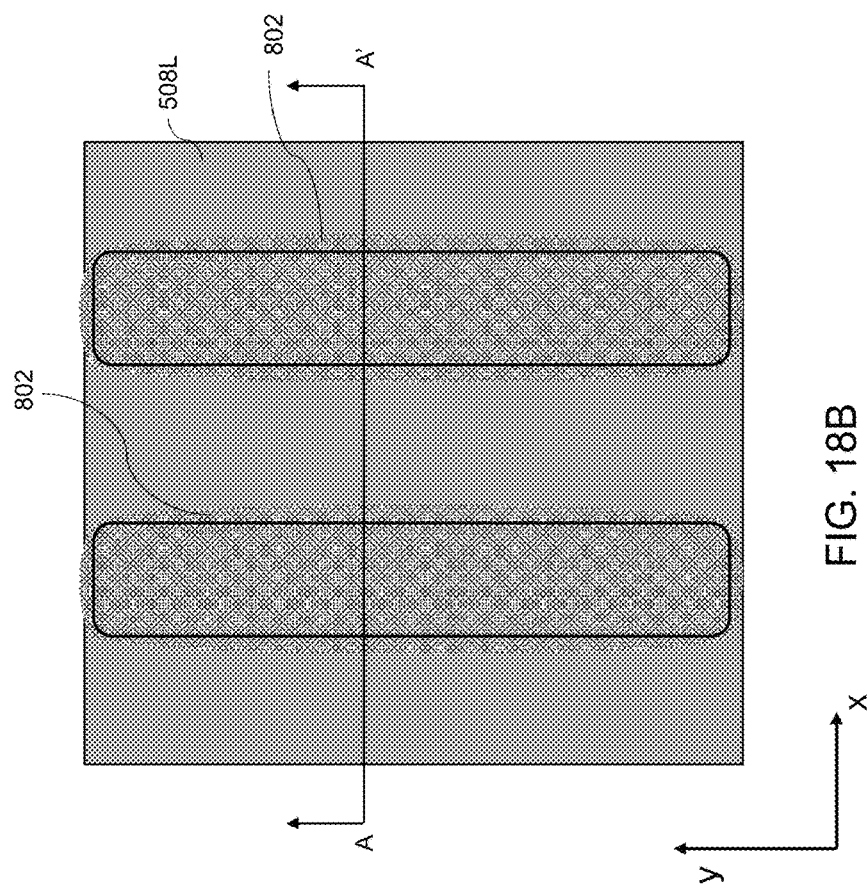
FIG. 18B is a top view of the intermediate structure of FIG. 18A, according to various embodiments.
Figure 18A:
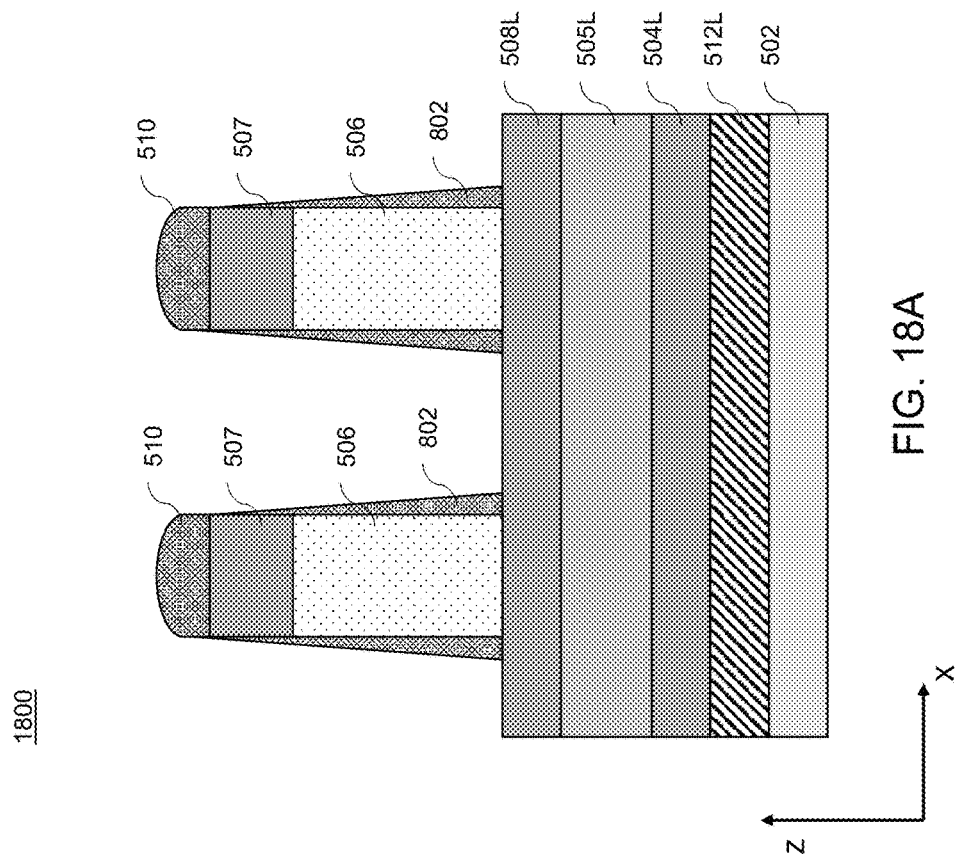
FIG. 18A is a vertical cross-sectional view of a further intermediate structure that may be used in the fabrication of a phase-change random-access memory structure, according to various embodiments.

FIG. 18A is a vertical cross-sectional view of a further intermediate structure 1800 that may be used in the fabrication of an alternative embodiment of a phase-change random-access memory structure, and FIG. 18B is a top view of the intermediate structure of FIG. 18A, according to various embodiments. The cross section A-A' shown in FIG.

18B indicates the cross sectional view of FIG. 18A. The intermediate structure 1800 may be formed from the intermediate structure 1700 by etching the oxygen-free patterned mask 510. For example, the oxygen-free patterned mask 510 may be physically etched by bombarding the oxygen-free patterned mask 510 with a suitable flow of ions. For example, the oxygen-free patterned mask 510 may be bombarded with argon ions. The process of bombarding the oxygen-free patterned mask 510 with argon ions may cause material to be removed from the oxygen-free patterned mask. Such removed material may form an oxygen-free spacer layer 802 over sidewalls of the phase-change element 506.

As described above, the oxygen-free patterned mask 510 may include SiN, SiC, or SiCN. As such, the oxygen-free spacer layer 802 may also include SiN, SiC, or SiCN. Further, the oxygen-free spacer layer 802 may further include argon that may become incorporated into the oxygen-free spacer layer 802 due to the interaction between the argon ions and the oxygen-free patterned mask 510. The oxygen-free spacer layer 802 may protect the phase-change memory element 506 during further processing. Further, the absence of oxygen in the oxygen-free spacer layer 802 may be beneficial in mitigating oxidation of the phase-change memory element 506.

In further embodiments, the oxygen-free patterned mask 510 may be etched using a chemical etching process. For example, an RIE process using a fluorine or chlorine plasma may be used to chemically etch material from the oxygen-free patterned mask 510. As with a physical etching process, described above, material may be removed from the oxygen-free patterned mask 510 and may thereby form the oxygen-free spacer layer 802. As such, with a chemical etch process, certain chemical species from the etch plasma may become incorporated into the oxygen-free spacer layer 802. For example, a RIE process that includes a fluorine and/or chlorine plasma may cause fluorine and/or chlorine to be incorporated into the oxygen-free spacer layer 802.

In certain embodiments, the oxygen-free patterned mask 510 may be etched with a combined physical/chemical etch process. For example, a physical etch may be followed by a chemical etch or vice versa. As such, the oxygen-free spacer layer 802 may include chlorine, fluorine, argon, chlorine and argon, fluorine and argon, or a mixture of chlorine, fluorine, and argon. Further, the oxygen-free spacer layer 802 may have a composition that varies with position within the oxygen-free spacer layer 802. For example, if a physical etch process is performed first followed by a chemical etch process, the oxygen-free spacer layer 802 that results from the combined process may have a composition that has a higher concentration of argon closer to sidewalls of the phase-change element 506 and a concentration of chlorine and/or fluorine that his higher is positions closer to external edges of the oxygen-free spacer layer 802.

FIG. 19A is a vertical cross-sectional view of a further intermediate structure 1900 that may be used in the fabrication of an alternative embodiment of a phase-change random-access memory structure, and FIG. 19B is a top view of the intermediate structure of FIG. 19A, according to various embodiments. The cross section A-A' shown in FIG. 19B indicates the cross sectional view of FIG. 19A. The intermediate structure 1900 may be formed from the intermediate structure 1800 by performing an anisotropic etch of the metal layer 512L, the first conducting layer 504L, the selector material layer 505L, and the second conducting layer 508L. For example, the remaining layers (512L, 504L, 505L, 508L) may be etched using an RIE process using a HBr plasma. Other etching techniques may be used in other embodiments.

Etching the second conducting layer 508L may thereby form a bottom electrode 508 of a phase change memory cell to be subsequently formed. Etching the selector material layer 505L may thereby form a selector element 505 and etching the first conductive layer 504L may form a selector electrode 504. Etching the metal layer 512L may form a first conductive structure 512. The first conductive structure 512 may be electrically connected to various interconnect structures (e.g., metal interconnect structures 326 in FIG. 3) formed below the substrate 502. In this regard, the first conductive structure 512 may form a word line for phase-change random-access memory structure to be formed subsequently. According to an embodiment, each of the first conductive structure 512, the selector electrode 504, selector element 505, the second electrode 508, and the and the top electrode 507 may have a width/diameter in a range from approximately 50 nm to approximately 60 nm and a height in a range from approximately 20 nm to approximately 50 nm.

Figures 20A, 20B:
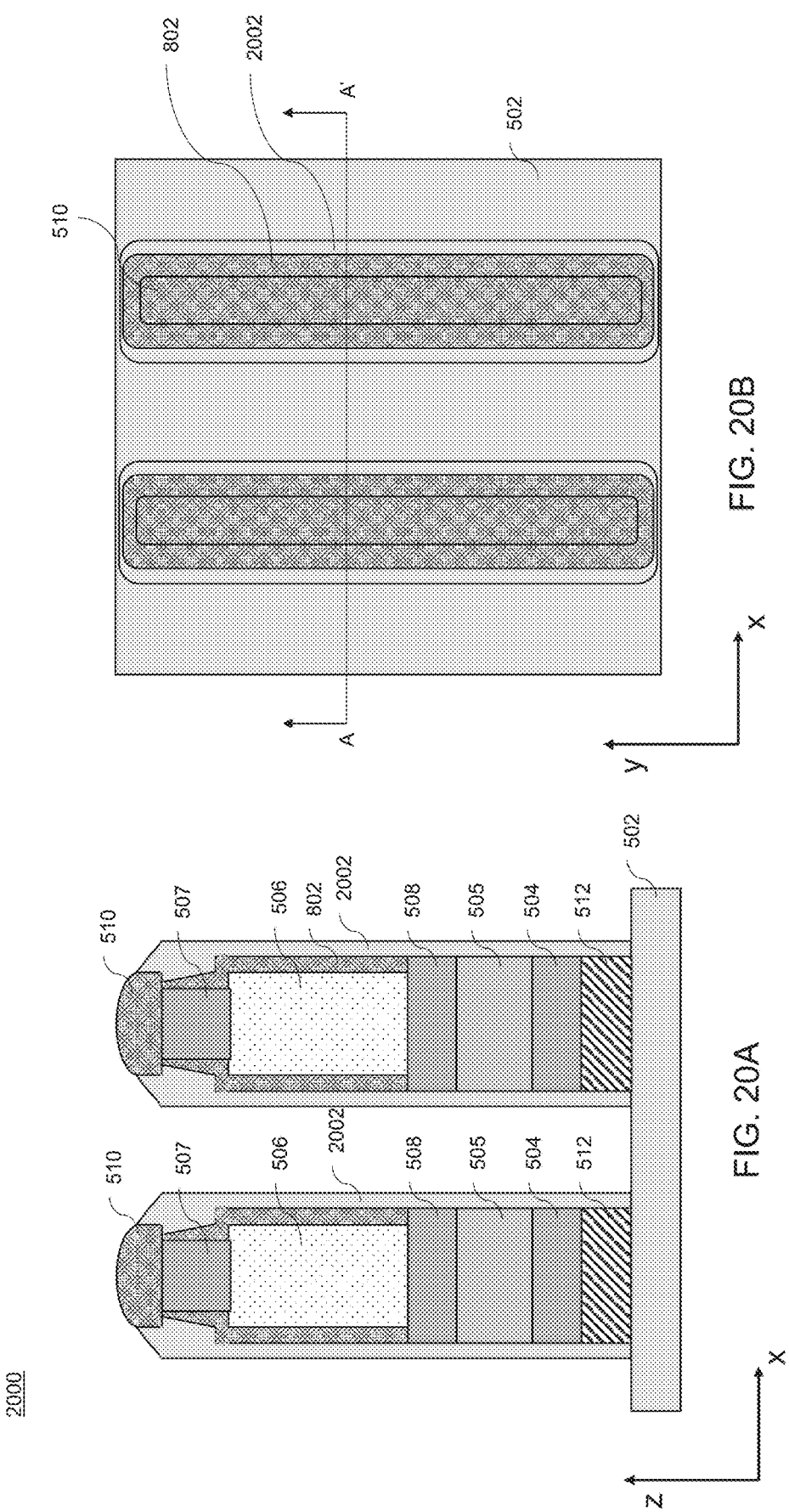
FIG. 20A is a vertical cross-sectional view of a further intermediate structure that may be used in the fabrication of a phase-change random-access memory structure, according to various embodiments.
FIG. 20B is a top view of the intermediate structure of FIG. 20A, according to various embodiments.

FIG. 20A is a vertical cross-sectional view of a further intermediate structure 2000 that may be used in the fabrication of an alternative embodiment of a phase-change random-access memory structure, and FIG. 20B is a top view of the intermediate structure of FIG. 20A, according to various embodiments. The cross section A-A' shown in FIG. 20B indicates the cross sectional view of FIG. 20A. The intermediate structure 2000 may be formed from the intermediate structure 1900 by forming a protective layer 2002 over the intermediate structure 1900. The protective layer 2002 may be formed by deposition of a dielectric material such as SiC, SiN, SiCN, etc., followed by an anisotropic etch process. According to an embodiment, the protective layer 2002 may have a thickness in a range from approximately 15 angstroms to 40 angstroms. Other dielectric materials may be used in other embodiments. In this example embodiment, the dielectric material may be chosen to protect the selector element 505 during further processing. The dielectric layer may further be chosen to be an oxygen-free dielectric layer to thereby mitigate oxidation of the selector element 505.

Figures 21A, 21B:
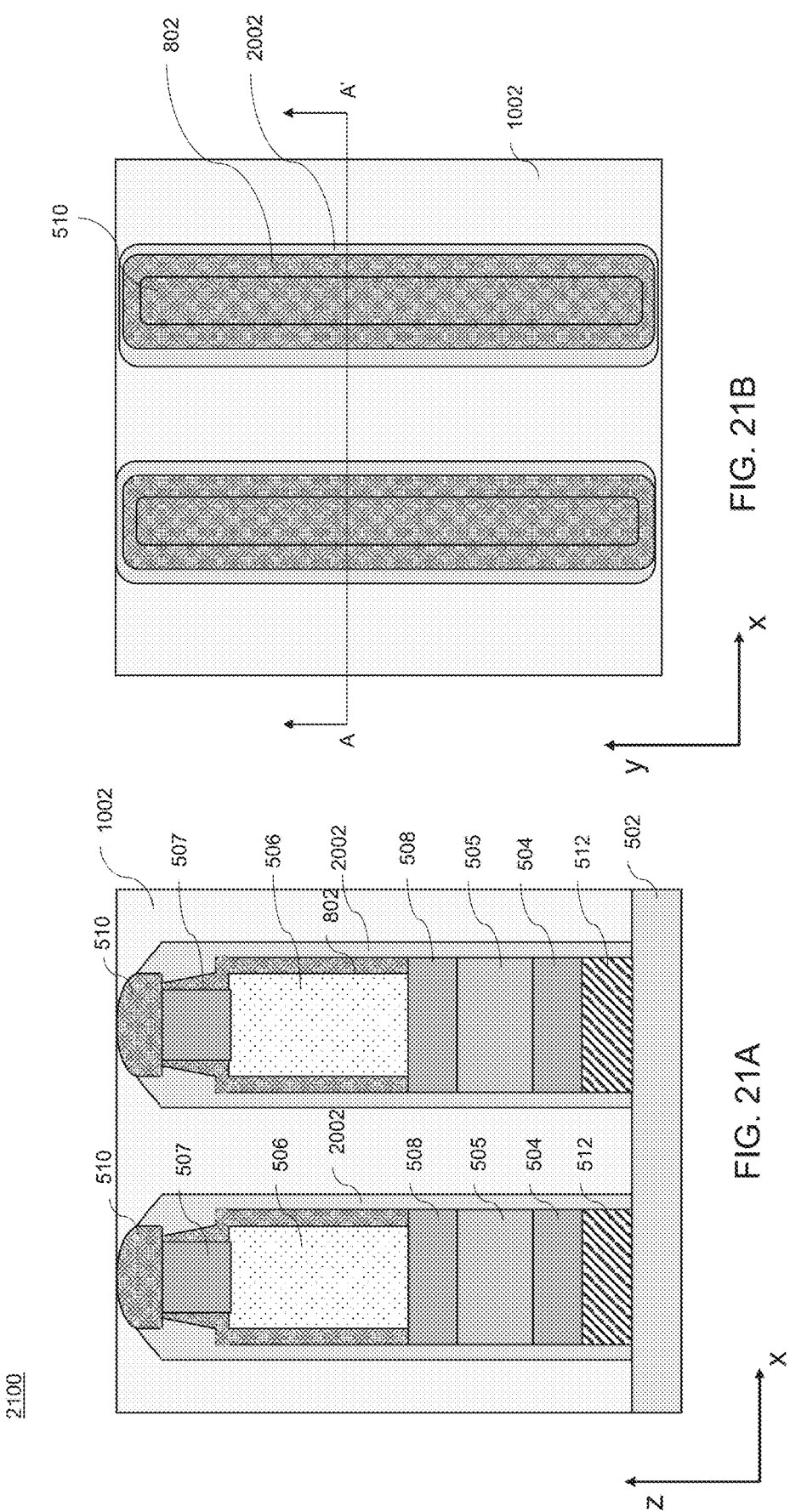
FIG. 21A is a vertical cross-sectional view of a further intermediate structure that may be used in the fabrication of a phase-change random-access memory structure, according to various embodiments.
FIG. 21B is a top view of the intermediate structure of FIG. 21a, according to various embodiments.

FIG. 21A is a vertical cross-sectional view of a further intermediate structure 2100 that may be used in the fabrication of a phase-change random-access memory structure, and FIG. 21B is a top view of the intermediate structure of FIG. 21A, according to various embodiments. The cross section A-A' shown in FIG. 21B indicates the cross sectional view of FIG. 21A. The intermediate structure 2100 may be formed from the intermediate structure 2000 by forming a dielectric layer 1002 over the intermediate structure 2000. In this regard, the dielectric layer 1002 may be the same material as the substrate 502. In alternative embodiments, the dielectric layer 1002 may be a different material from that of the substrate 502.

The dielectric layer 1002 may include, for example, undoped silicate glass, a doped silicate glass (e.g., deposited by decomposition of tetraethylorthosilicate (TEOS)), organosilicate glass, silicon oxide, silicon oxynitride, or silicon carbide nitride. Other dielectric materials are within the contemplated scope of this disclosure. The dielectric layer 1002 may be deposited by a conformal deposition process (such as a chemical vapor deposition process) or a self-planarizing deposition process (such as spin coating). Excess portions of the dielectric layer 1002 may be removed from above the top surface of the structure (e.g., above the oxygen-free patterned mask 510) by a planarization process, for example, by chemical mechanical planarization (CMP).

FIG. 22A is a vertical cross-sectional view of an alternative embodiment of a phase-change random-access memory structure 200 (e.g., see FIG. 2), and FIG. 22B is a top view of the phase-change random-access memory structure of FIG. 22A, according to various embodiments. The cross section A-A' shown in FIG. 22B indicates the cross sectional view of FIG. 22A. The intermediate structure 2200 may be formed by removing the oxygen-free patterned mask 510 (e.g., by etching and/or by planarization) from the intermediate structure 2100 and subsequently forming electrically conductive lines 2202 in an upper portion of the dielectric layer 1002. As shown in FIG. 22B, for example, the electrically conductive lines 2202 may be extend laterally along the first direction (e.g., along the x direction in FIGS. 22A and 22B) and may be separated from one another along the second direction (e.g., along the y direction in FIG. 22B).

At least one conductive material may be deposited over a planar surface of the dielectric layer 1002, and may be patterned to form the electrically conductive lines 2202. In this case, an additional insulating material (e.g., material that is the same or different from dielectric layer 1002) may be deposited between the electrically conductive lines 2202, and may be subsequently planarized to provide top surfaces that are coplanar with the top surfaces of the first electrically conductive lines 2202. The additional insulating material may be incorporated into the dielectric layer 1002. Alternatively, the electrically conductive lines 2202 may be formed, for example, by forming line trenches that laterally extend along a first horizontal direction (e.g., in the x direction in FIGS. 22A and 22B) in an upper portion of the dielectric layer 1002, and by depositing and planarizing at least one conductive material. The at least one conductive material may include a metallic liner material such as TiN, TaN, and/or WN and a metallic fill material such as W, Cu, Co, Mo, Ru, another metal, or an intermetallic alloy.

In one embodiment, the first electrically conductive lines 2202 may be formed as a periodic structure, that is, as a one-dimensional periodic array of electrically conductive lines 2202. In this case, the electrically conductive lines 2202 may have a first uniform pitch along the second horizontal direction y. In one embodiment, the electrically conductive lines 2202 may have a uniform vertical cross-sectional shape (not shown) within vertical planes that are perpendicular to the cross section A-A' of FIG. 22A. Each of the electrically conductive lines 2202 may have a thickness in a range from 5 nm to 600 nm, such as from 20 nm to 100 nm, although lesser and greater thicknesses may also be employed. The width of each first electrically conductive line 2202 may be in a range from 5 nm to 300 nm, such as from 20 nm to 100 nm, although lesser and greater widths may also be employed.

The electrically conductive lines 2202 may be configured to form a plurality of bit lines 204 (e.g., see FIG. 2 and related description, above) and the conductive structures 512 may be configured to form a plurality of word lines 202 of the phase-change random-access memory structure 200. In this regard, the electrically conductive lines 2202 may be electrically connected to the top electrode 507 of the phase-change memory cell 102. Similarly, the conductive structure 512 may be electrically connected to the selector electrode 504.

FIG. 23A is a vertical cross-sectional view of a further intermediate structure 2300 that may be used in the fabrication of another alternative embodiment of a phase-change random-access memory structure, and FIG. 23B is a top view of the intermediate structure of FIG. 23A, according to various embodiments. The cross section A-A' shown in FIG. 23B indicates the cross sectional view of FIG. 23A. The intermediate structure 2300 may be formed from the intermediate structure 1500 of by patterning the dielectric layer 510L (e.g., see FIGS. 15A and 15B) to form an oxygen-free patterned mask 510 on the third conducting layer 507L. As shown in FIG. 23B, the dielectric layer may be patterned as a two-dimensional array of isolated structures. The dielectric layer 510L may be patterned by depositing a photoresist (not shown) over the dielectric layer 510L and patterning the photoresist using photolithographic techniques. The patterned photoresist may then be used as a mask for etching the dielectric layer 510L using an anisotropic etching process that is selective to the third conducting layer 507L. The patterned photoresist may then be removed by ashing or by dissolution with a solvent.

Figures 24A, 24B:
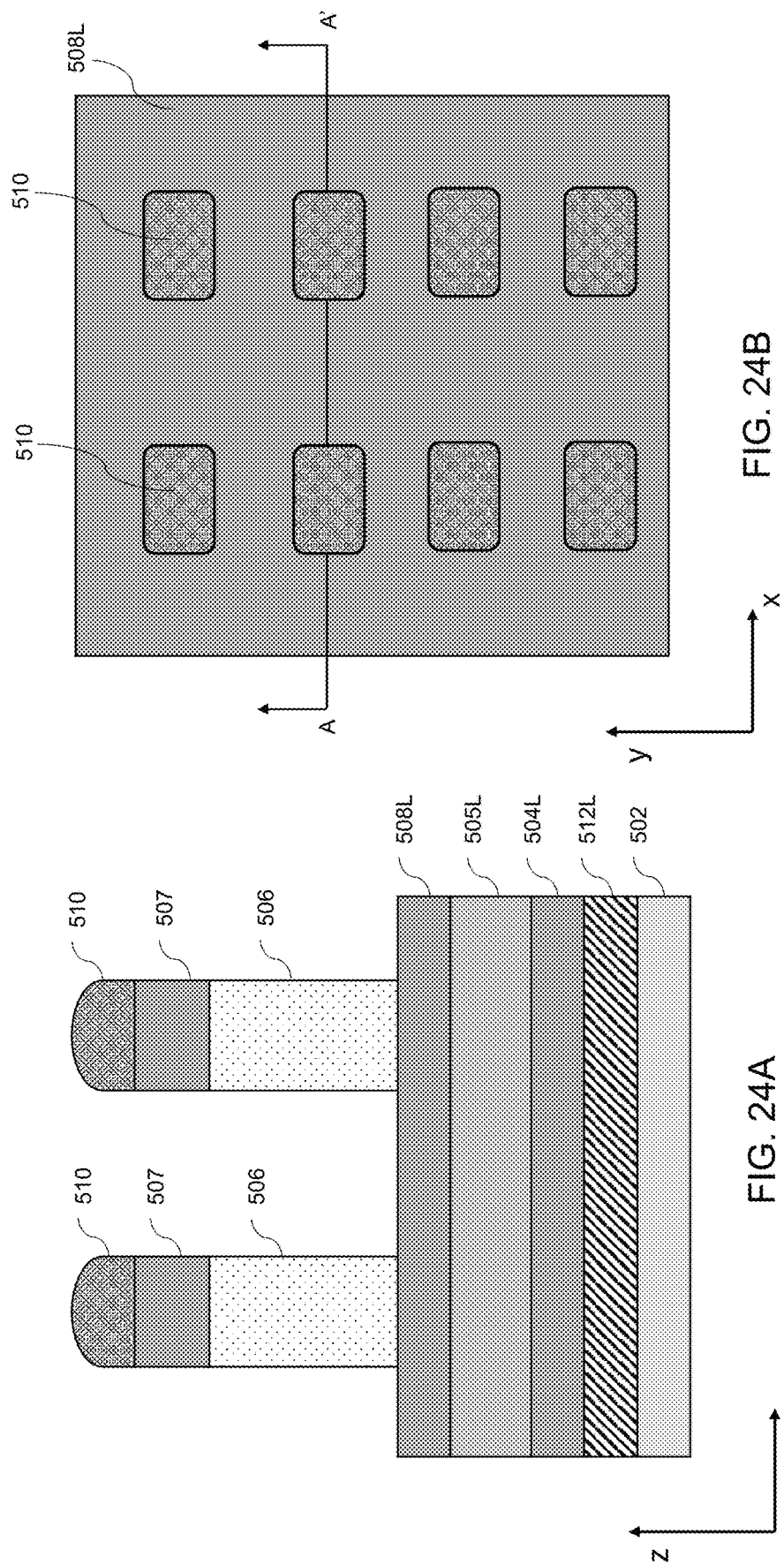
FIG. 24A is a vertical cross-sectional view of a further intermediate structure that may be used in the fabrication of a phase-change random-access memory structure, according to various embodiments.
FIG. 24B is a top view of the intermediate structure of FIG. 24A, according to various embodiments.

FIG. 24A is a vertical cross-sectional view of a further intermediate structure 2400 that may be used in the fabrication of another alternative embodiment of a phase-change random-access memory structure, and FIG. 24B is a top view of the intermediate structure of FIG. 24A, according to various embodiments. The cross section A-A' shown in FIG. 24B indicates the cross sectional view of FIG. 24A. The intermediate structure 2400 may be formed from the intermediate structure 2300 by etching the third conducting layer 507L and the phase-change material layer 506L using the oxygen-free patterned mask 510 using processes similar to those described above with reference to FIGS. 17A and 17B.

A phase-change element 506 and a top electrode 507 for a phase-change memory cell may thereby be formed by respectively etching the third conducting layer 507L and the phase-change material layer 506L. The phase-change element 506 and the top electrode 507 are now formed as pillar structures, due to the configuration of the oxygen-free patterned mask 510 as a two-dimensional array of isolated structures. In contrast, the phase-change element 506 and the top electrode 507 of the embodiments described above with reference to FIGS. 17A and 17B were formed as linear structures extending along the y direction as shown, for example, in FIG. 17B.

In a further etching process (e.g., described above with reference to FIGS. 19A and 19B), the second conducting layer 508L may be etched to form a bottom electrode 508 for a phase-change memory cell. The selector material layer 505L, the first conducting layer 504L and the metal layer 512L may similarly be etched. These additional layers (512L, 504L, 505L, 508L) may be etched using various processes, as described above. As described in previous embodiments, a protective layer may be formed over sidewalls of the phase-change element 506 to thereby protect the phase-change element 506 during additional processes used to etch the remaining layers (512L, 504L, 505L, 508L), as described in greater detail with reference to FIGS. 25A and 25B, below.

Figures 25A, 25B:
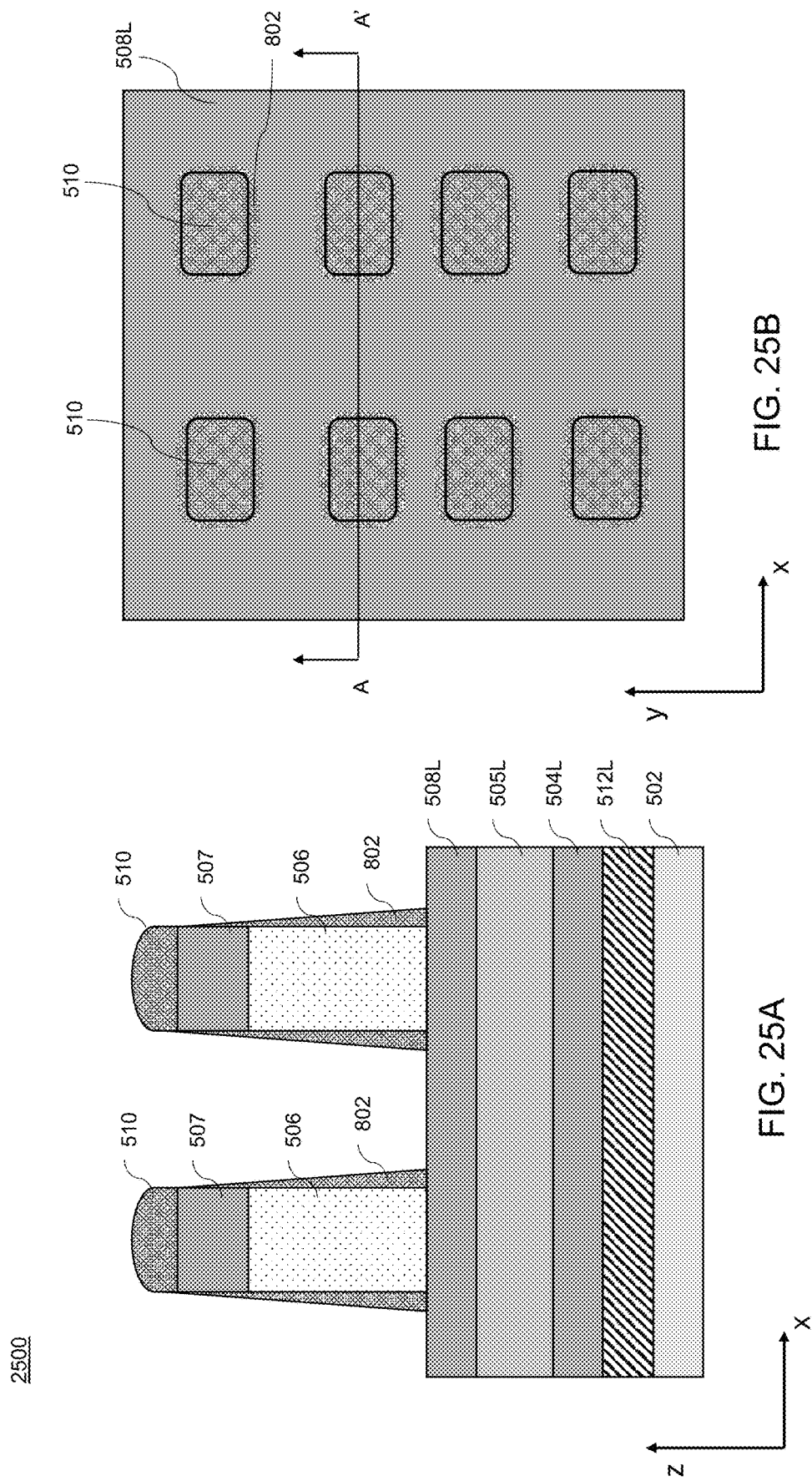
FIG. 25A is a vertical cross-sectional view of a further intermediate structure that may be used in the fabrication of a phase-change random-access memory structure, according to various embodiments.
FIG. 25B is a top view of the intermediate structure of FIG. 25A, according to various embodiments.

FIG. 25A is a vertical cross-sectional view of a further intermediate structure 2500 that may be used in the fabrication of another alternative embodiment of a phase-change random-access memory structure, and FIG. 25B is a top view of the intermediate structure of FIG. 25A, according to various embodiments. The cross section A-A' shown in FIG. 25B indicates the cross sectional view of FIG. 25A. The intermediate structure 2500 may be formed from the intermediate structure 2400 by etching the oxygen-free patterned mask 510 using processes similar to those described with reference to FIGS. 18A and 18B, above. For example, a physical etch (e.g., bombardment with argon or other ions)

and/or a chemical etch (e.g., a RIE process using a chlorine or fluorine plasma) may be performed. Such etching processes may thereby generate an oxygen-free spacer layer 802 over sidewalls of the phase-change element 506.

As described above, the oxygen-free patterned mask 510 may include SiN, SiC, or SiCN. As such, the oxygen-free spacer layer 802 may also include SiN, SiC, or SiCN. The oxygen-free spacer layer 802 may protect the phase-change memory element 506 during further processing. Further, the absence of oxygen in the oxygen-free spacer layer 802 may be beneficial in mitigating oxidation of the phase-change element 506. In certain embodiments, the oxygen-free patterned mask 510 may be etched using a physical or chemical etch. In certain other embodiments, the oxygen-free patterned mask 510 may be etched with a combined physical/chemical etch process. For example, a physical etch may be followed by a chemical etch or vice versa. As such, the oxygen-free spacer layer 802 may include chlorine, fluorine, argon, chlorine and argon, fluorine and argon, or a mixture of chlorine, fluorine, and argon.

Further, the oxygen-free spacer layer 802 may have a composition that varies with position within the oxygen-free spacer layer 802. For example, if a physical etch process is performed first followed by a chemical etch process, the oxygen-free spacer layer 802 that results from the combined process may have a composition that has a higher concentration of argon closer to sidewalls of the phase-change element 506 and a concentration of chlorine and/or fluorine that his higher is positions closer to external edges of the oxygen-free spacer layer 802.

The intermediate structure 2500 may be further processed by performing operations similar to those described above with reference to FIGS. 19A to 22B to thereby generate a phase-change random-access memory structure similar to the phase-change random-access memory structure 200 of FIGS. 22A and 22B. However, the phase-change random-access memory structure 200 formed from the intermediate structure 2500 may have advantages over the phase-change random-access memory structure 200 formed from the intermediate structure 1800 of FIGS. 18A and 18B. In this regard, the pillar structures of FIGS. 25A and 25B include the oxygen-free spacer layer 802 formed on four sides of the phase-change element 506. As such, the phase-change element 506 may be better protected during further processing. The resulting phase-change random-access memory structure 200 may therefore have a phase-change element 506 having higher quality than a corresponding phase-change element 506 in a phase-change random-access memory structure 200 formed from the intermediate structure 1800 of FIGS. 18A and 18B.

Figures 26A, 26B:
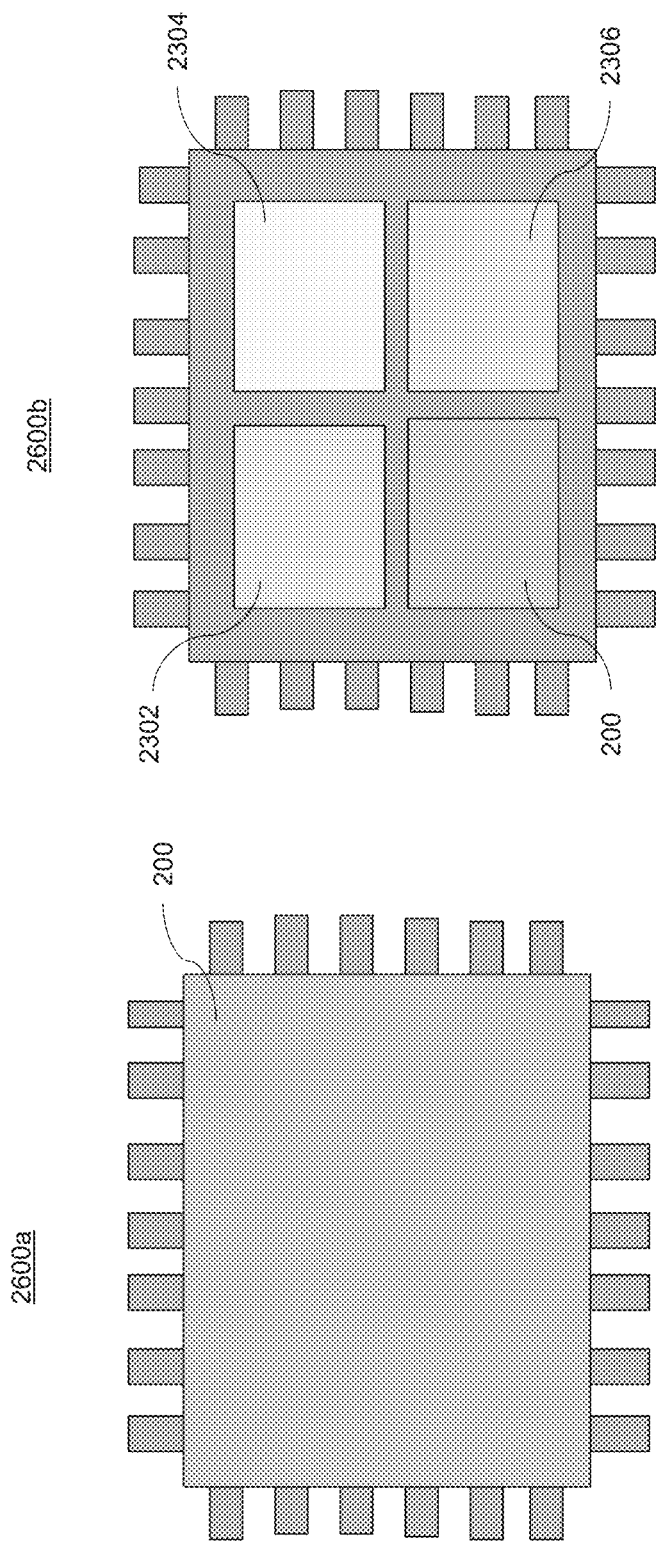
FIG. 26A is a top view of a first memory chip including a phase-change random-access memory structure, according to various embodiments.
FIG. 26B is a top view of a second memory chip including a phase-change random-access memory structure, according to various embodiments.

FIG. 26A is a top view of a first memory chip 2600a including a phase-change random-access memory structure, and FIG. 26B is a top view of a second memory chip 2600b including a phase-change random-access memory structure, according to various embodiments. The first memory chip 2600a may include a phase-change random-access memory structure 200 configured as a standalone memory device. Alternatively, as shown in FIG. 26B, the second memory chip 2600b may be a chip package structure having several component dies. For example, the second memory chip 2600b may include a memory die including a phase-change random-access memory structure 200 coupled with other components. The second memory chip 2600b may further include a CPU die 2302, an SRAM die 2304, an analog circuit die 2306, etc. Other embodiments may include various other configurations in which the phase-change random-access memory structure 200 may be coupled with other components.

Figure 27:
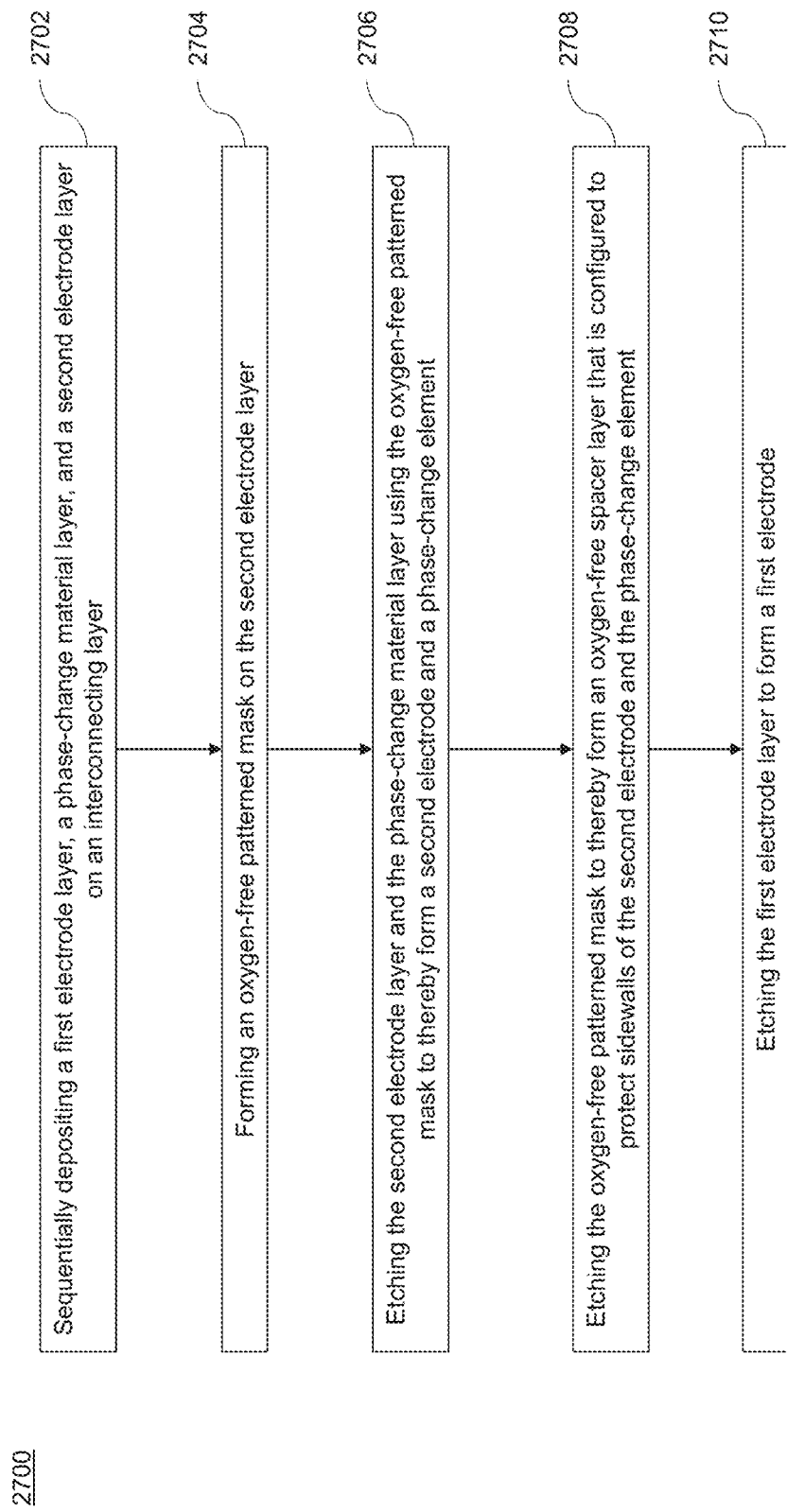
FIG. 27 is a flowchart illustrating operations of a method 2700 of manufacturing a phase-change memory device, according to various embodiments.

FIG. 27 is a flowchart illustrating operations of a method 2700 of manufacturing a phase-change memory device, according to various embodiments. In operation 2702, the method 2700 may include sequentially depositing a first conducting layer 504L, a phase-change material layer 506L, and a second conducting layer 508L on an interconnect layer 512 (e.g., see FIG. 5 and related description). In operation 2704, the method 2700 may include forming an oxygen-free patterned mask 510 on the second conducting layer 508L (e.g., see FIGS. 6, 13, 16A, 16B, 23A and 23B). In operation 2706, the method 2700 may include etching the second conducting layer 508L and the phase-change material layer 506L using the oxygen-free patterned mask 510 to form a second electrode (e.g., top electrode 508) and a phase-change element 506 (e.g., see FIGS. 7, 14, 17A, and 24A).

In operation 2708, the method 2700 may include etching the oxygen-free patterned mask 510 to thereby form an oxygen-free spacer layer 802 that is configured to protect sidewalls of the second electrode and the phase-change element, such that the oxygen-free spacer layer comprises mask material etched from the oxygen-free patterned mask (e.g., see FIGS. 8, 14, 18A, 18B, 25A, and 25B). In operation 2710, the method 2700 may include etching the first conducting layer 504L to thereby form a first electrode (e.g., bottom electrode 504 of FIGS. 9 and 14; bottom electrode 508 of FIG. 19A). With regard to forming the oxygen-free patterned mask 510 in operation 2704, the method 2700 may further include depositing a SiN layer, a SiC layer, or a SiCN layer over the second conducting layer 508L, and patterning the SiN layer, the SiC layer, or the SiCN layer to thereby form the oxygen-free patterned mask 510.

In additional embodiments (e.g., see FIGS. 19A, and 24A), the method 2700 may further include forming a selector element 505 between the first electrode 504 and the phase-change element 506 or between the phase-change element 506 and the second electrode (e.g., top electrode 507). In this regard, the method 2700 may further include forming the selector element 505 further by depositing and patterning one or more of a GeSeAs alloy, a GeTeAs alloy, a GeSeTe alloy, a GeSe alloy, a SeAs alloy, a AsTe alloy, a GeTe alloy, a SiTe alloy, a SiAsTe alloy, or a SiAsSe alloy, with atomic compositions for constituent elements ranging from 5 to 95%.

With regard to etching the oxygen-free patterned mask 510 in operation 2708, the method 2700 may further include performing one or both of a physical etching process and a chemical etching process to remove material from the oxygen-free patterned mask 510 such that the material removed from the oxygen-free patterned mask 510 forms the oxygen-free spacer layer 802. When performing the physical etching process, the method 2700 may further include bombarding the oxygen-free patterned mask with argon ions, and when performing the chemical etching process, the method 2700 may further include performing a reactive ion etching process using fluorine ions or chlorine ions.

In operation 2708, the method 2700 may further include performing one or both of the physical etching process and the chemical etching process such that the oxygen-free spacer layer further comprises chlorine, fluorine, argon, chlorine and argon, fluorine and argon, or a mixture of chlorine, fluorine, and argon. In operation 2708, the method 2700 may further include performing one or both of the physical etching process and the chemical etching process such that the oxygen-free spacer layer comprises a composition that varies with position within the oxygen-free spacer layer.

With regard to depositing the phase-change material layer in operation 2702, the method 2700 may further include depositing a germanium-antimony-tellurium alloy or an aluminum-antimony alloy. The method 2700 may further include depositing a carbon layer 1302L (e.g., see FIG. 13) after depositing the first conducting layer 504L and before depositing the phase-change material layer 506L such that the carbon layer 1302L is formed between the first conducting layer 504L and the phase-change material layer 506L. The method 2700 may further include pattering the carbon layer 1302L to form a heater element 1302 (e.g., see FIG. 14). In alternative embodiments, the heater element 1302 may be formed between the phase change material layer 506L and the second conducting layer 508L.

Referring to all drawings and according to various embodiments of the present disclosure, a phase-change memory device 102 (e.g., see FIGS. 1 to 4, 12, and 14) is provided. The phase-change memory device 102 may include a first electrode 504 formed over an interconnect layer 512; a phase-change memory element 506 formed over the first electrode 504; a second electrode 508 formed over the phase-change memory element 506; and an oxygen-free spacer layer 802 formed over sidewalls of the phase-change memory element 506. The phase-change memory element 506 may include a germanium-antimony-tellurium alloy or an aluminum-antimony alloy. In further embodiments, the phase-change memory device 102 may further include a carbon layer (e.g., heater element 1302) formed between the first electrode 504 and the phase-change memory element 506. The oxygen-free spacer layer 802 may include SiN, SiC, or SiCN and may further include chlorine, fluorine, argon, chlorine and argon, fluorine and argon, or a mixture of chlorine, fluorine, and argon. The oxygen-free spacer layer 802 may further include a composition that varies with position within the oxygen-free spacer layer 802.

In a further embodiment, a phase-change random-access memory structure 200 (e.g., see FIGS. 2, 22A, 22B, 26A, and 26B) is provided. The phase-change random-access memory structure 200 may include a plurality of word lines 202 (e.g., conductive structure 512 in FIG. 22A); a plurality of bit lines 204 (e.g., electrically conductive lines 2202 in FIG. 22A); and a plurality of phase-change memory cells 506 (e.g., FIG. 22A). Each of the phase-change memory cells 506 may include a first electrode 504 electrically connected to a word line; a selector element 505 formed over the first electrode 504, wherein the selector element 505 has a non-ohmic current-voltage characteristic; a phase-change memory element 506 formed over the selector element 505; a second electrode (e.g., top electrode 507) formed over the phase-change memory element 506 and electrically connected to a bit line; and an oxygen-free spacer layer 802 formed over sidewalls of the phase-change memory element 506.

The phase-change memory element 506 may further include one of Ge2Sb2Te5, GeTe—Sb2Te3, and Al50Sb50, and the selector element 505 may include one or more of a GeSeAs alloy, a GeTeAs alloy, a GeSeTe alloy, a GeSe alloy, a SeAs alloy, a AsTe alloy, a GeTe alloy, a SiTe alloy, a SiAsTe alloy, or a SiAsSe alloy, with atomic compositions for constituent elements ranging from 5 to 95%. The oxygen-free spacer layer 802 may include SiN, SiC, or SiCN, and may further include chlorine, fluorine, argon, chlorine and argon, fluorine and argon, or a mixture of chlorine, fluorine, and argon. The oxygen-free spacer layer 802 may further include a composition that varies with position within the oxygen-free spacer layer.

The above-described embodiment provide several advantages over conventional phase-change memory devices. For example, the oxygen-free spacer layer 802 may provide protection for the phase-change memory element 506 during further processing. Without the oxygen-free spacer layer 802, additional etch process that are used to pattern various other layers (512, 504, 505, 508) may cause damage to the phase-change memory element 506.

Further, the use of oxygen-free materials (e.g., SiC, SiN, SiCN) may mitigate oxidation of the phase-change memory element 506. As described above, the phase change memory device 102 (e.g., see FIGS. 1 to 4, 12, 14) and the phase-change random-access memory structure 200 (e.g., see FIGS. 2, 3, 22A, 22B, 26A, and 26B) may be processed in such a way that the oxygen-free spacer layer 802 may be formed in-situ, that is, without breaking vacuum. As such, exposure of the phase-change memory element 506 to oxygen may be avoided, further mitigating issues related to oxidation of the phase-change memory element 506 that otherwise might arise.

The above-disclosed embodiments may also be formed in a BEOL process and may be incorporated with other BEOL circuit components such as TFT devices. As such, the disclosed phase-change memory device may include materials that may be processed at low temperatures and thus, may not damage previously fabricated devices (e.g., FEOL and MEOL devices).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A phase-change memory device, comprising:
   a first electrode formed over an interconnect layer;
   a phase-change memory element formed over the first electrode;
   a second electrode formed over the phase-change memory element; and
   an oxygen-free spacer layer formed over sidewalls of the phase-change memory element, wherein the oxygen-free spacer layer directly contacts the sidewalls of the phase-change memory element.

2. The phase-change memory device of claim 1, wherein the phase-change memory element further comprises a germanium-antimony-tellurium alloy or an aluminum-antimony alloy.

3. The phase-change memory device of claim 1, further comprising a carbon layer formed between the first electrode and the phase-change memory element.

4. The phase-change memory device of claim 1, wherein the oxygen-free spacer layer comprises SiN, SiC, or SiCN.

5. The phase-change memory device of claim 4, wherein the oxygen-free spacer layer further comprises chlorine, fluorine, argon, a mixture of chlorine and argon, a mixture of fluorine and argon, or a mixture of chlorine, fluorine, and argon.

6. The phase-change memory device of claim 4, wherein the oxygen-free spacer layer comprises a composition that varies with position within the oxygen-free spacer layer.

7. A phase-change random-access memory structure, comprising:
   a plurality of word lines;
   a plurality of bit lines; and
   a plurality of phase-change memory cells, each comprising:
      a first electrode electrically connected to a word line;
      a selector element formed over the first electrode, wherein the selector element has a non-ohmic current-voltage characteristic;
      a phase-change memory element formed over the selector element;
      a second electrode formed over the phase-change memory element and electrically connected to a bit line; and
      an oxygen-free spacer layer formed over sidewalls of the phase-change memory element, wherein the oxygen-free spacer layer directly contacts the sidewalls of the phase-change memory element.

8. The memory structure of claim 7, wherein the phase-change memory element further comprises one of $Ge_2Sb_2Te_5$, $GeTe$—$Sb_2Te_3$, and $Al_{50}Sb_{50}$.

9. The memory structure of claim 7, wherein the selector element comprises one or more of a GeSeAs alloy, a GeTeAs alloy, a GeSeTe alloy, a GeSe alloy, a SeAs alloy, a AsTe alloy, a GeTe alloy, a SiTe alloy, a SiAsTe alloy, or a SiAsSe alloy, with atomic compositions for constituent elements ranging from 5 to 95%.

10. The memory structure of claim 7, wherein the oxygen-free spacer layer comprises SiN, SiC, or SiCN.

11. The memory structure of claim 10, wherein the oxygen-free spacer further comprises chlorine, fluorine, argon, chlorine and argon, fluorine and argon, or a mixture of chlorine, fluorine, and argon.

12. The memory structure of claim 10, wherein the oxygen-free spacer layer comprises a composition that varies with position within the oxygen-free spacer layer.

13. A phase-change memory device, comprising:
   a first electrode formed over an interconnect layer;
   a carbon layer formed over the first electrode;
   a phase-change memory element formed over the carbon layer;
   a second electrode formed over the phase-change memory element;
   an oxygen-free spacer layer formed over sidewalls of the phase-change memory element, wherein the oxygen-free spacer layer directly contacts the sidewalls of the phase-change memory element;
   an oxygen-free patterned mask on the second electrode; and
   a conductive metal via formed through the oxygen-free patterned mask on the second electrode.

14. The phase-change memory device of claim 13, wherein the oxygen-free patterned mask comprises SiN, SiC, or SiCN.

15. The phase-change memory device of claim 13, wherein the oxygen-free patterned mask has the top surface rounded.

16. The phase-change memory device of claim 13, wherein the oxygen-free spacer layer further extends over the sidewalls of the second electrode and the carbon layer.

17. The phase-change memory device of claim 16, wherein the oxygen-free spacer layer comprises SiN, SiC, or SiCN.

18. The memory structure of claim 16, wherein the oxygen-free spacer further comprises chlorine, fluorine, argon, chlorine and argon, fluorine and argon, or a mixture of chlorine, fluorine, and argon.

19. The memory structure of claim 13, wherein the oxygen-free spacer layer comprises a composition that varies with position within the oxygen-free spacer layer.

20. The memory structure of claim 13, wherein the carbon layer has a patterning to form a heater element.

* * * * *